(12) United States Patent
Natsume et al.

(10) Patent No.: US 8,497,062 B2
(45) Date of Patent: Jul. 30, 2013

(54) RESIN FOR FORMATION OF UPPER ANTIREFLECTIVE FILM, COMPOSITION FOR FORMATION OF UPPER ANTIREFLECTIVE FILM, AND RESIST PATTERN FORMATION METHOD

(75) Inventors: Norihiro Natsume, Tokyo (JP); Norihiko Sugie, Tokyo (JP); Junichi Takahashi, Tokyo (JP)

(73) Assignee: JSR Corporation, Tokyo (JP)

( * ) Notice: Subject to any disclaimer, the term of this patent is extended or adjusted under 35 U.S.C. 154(b) by 415 days.

(21) Appl. No.: 12/530,624

(22) PCT Filed: Mar. 13, 2008

(86) PCT No.: PCT/JP2008/054658
§ 371 (c)(1),
(2), (4) Date: Sep. 10, 2009

(87) PCT Pub. No.: WO2008/126625
PCT Pub. Date: Oct. 23, 2008

(65) Prior Publication Data
US 2010/0112475 A1 May 6, 2010

(30) Foreign Application Priority Data

Mar. 23, 2007 (JP) ................. 2007-077689
Mar. 28, 2007 (JP) ................. 2007-085726

(51) Int. Cl.
*G03F 7/32* (2006.01)
*C08F 12/32* (2006.01)
*G03F 7/11* (2006.01)

(52) U.S. Cl.
USPC ......... 430/325; 430/273.1; 430/326; 430/311

(58) Field of Classification Search
None
See application file for complete search history.

(56) References Cited

U.S. PATENT DOCUMENTS

2006/0046184 A1* 3/2006 Jung et al. .............. 430/270.1
2006/0063104 A1* 3/2006 Jung et al. .............. 430/270.1
(Continued)

FOREIGN PATENT DOCUMENTS

| JP | 2002-311585 | | 10/2002 |
| JP | 2007316188 A | * | 12/2007 |
| WO | WO 2007023710 a1 | * | 3/2007 |

OTHER PUBLICATIONS

English translation of JP, 2007-316188, A (2007) from machine translation from AIPN Japan Patent Office National Center for Industrial Property Information and Training, generated Mar. 11, 2012, 27 pages.*
T. Tanaka, N. Hasegawa, H. Shiraishi, and S. Okazaki. A New Photolithography Technique with Antireeflective Coating on Resist: ARCOR J. Electrochem. Soc., Dec. 1990, pp. 3900-3904, vol. 137, No. 12, The Electrochemical Society, Inc.

(Continued)

*Primary Examiner* — Cynthia Hamilton
(74) *Attorney, Agent, or Firm* — Ditthavong Mori & Steiner, P.C.

(57) ABSTRACT

The objective of the present invention is to provide a resin for forming an upper antireflective film and a composition for forming an upper antireflective film that can reduce a standing wave effect satisfactorily and lead excellent solubility in an alkaline developer in lithography and a method for forming a resist pattern. Specifically, the resin for forming an upper antireflective film has at least one unit selected from a repeating unit represented by the formula (1) and a repeating unit represented by the formula (2), has a weight average molecular weight of 1,000 to 100,000 as measured by GPC method, and is soluble in an alkaline developer. (In the formulae (1) and (2), $R^1$ to $R^{14}$ independently represent a hydrogen atom, —OH, —COOH or —SO$_3$H, provided that all of $R^1$ to $R^7$ or $R^8$ to $R^{14}$ do not represent a hydrogen atom in a molecule.)

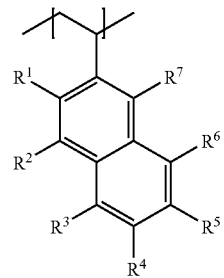

(1)

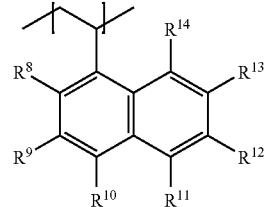

(2)

4 Claims, 1 Drawing Sheet

U.S. PATENT DOCUMENTS

2006/0223008 A1* 10/2006 Yoshimura et al. ............ 430/311
2007/0087285 A1* 4/2007 Huang et al. ................ 430/270.1
2007/0122740 A1* 5/2007 Hatakeyama et al. ...... 430/270.1
2008/0026315 A1* 1/2008 Huang et al. ................ 430/270.1
2009/0253076 A1* 10/2009 Sakaguchi et al. .......... 430/286.1

OTHER PUBLICATIONS

Japanese Office Action for corresponding JP Application No. 2007-077689, Jul. 17, 2012.

* cited by examiner

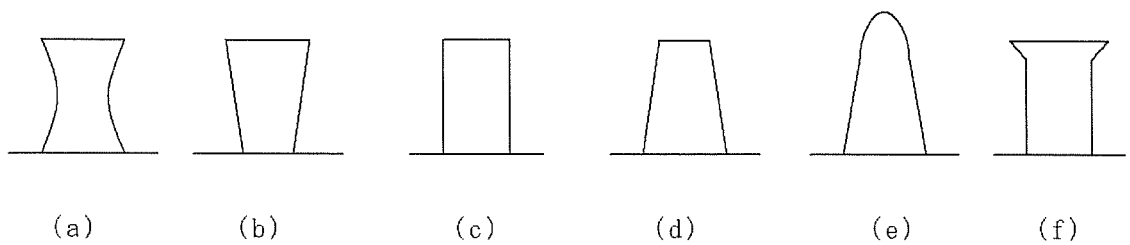
(a)  (b)  (c)  (d)  (e)  (f)

RESIN FOR FORMATION OF UPPER ANTIREFLECTIVE FILM, COMPOSITION FOR FORMATION OF UPPER ANTIREFLECTIVE FILM, AND RESIST PATTERN FORMATION METHOD

TECHNICAL FIELD

The present invention relates to a resin for formation of an upper antireflective film, a composition for formation of an upper antireflective film and a resist pattern formation method. More specifically, the present invention relates to a resin for formation of an upper antireflective film and a composition for formation of an upper antireflective film that can reduce a standing wave effect satisfactorily and lead excellent solubility in an alkaline developer in lithography (193-nm lithography in particular) and a method for forming a resist pattern. Additionally, the present invention relates to a composition for formation of an upper antireflective film that can reduce a standing wave effect and blob defects satisfactorily and lead excellent solubility in an alkaline developer in lithography (193-nm lithography in particular) and a method for forming a resist pattern.

BACKGROUND ART

Hitherto, processing size has been becoming finer in lithography to obtain a higher integration degree in the field of fine processing technique, a typical example of which is the production of integrated circuit elements. Lithographic technique has been recently required which is capable of attaining fine processing at a level of about 200 nm or less, using an ArF excimer laser (wavelength: 193 nm), a $F_2$ excimer laser (wavelength: 157 nm) and the like. As a resist suitable for irradiation with such an excimer laser, suggested are many resists making use of chemically amplifying effect (hereinafter referred to as "chemically amplification type resist") based on a component having an acid-disassociating functional group and a component which is subjected to irradiation with a radiation (hereinafter referred to as "exposure") so as to generate an acid (hereinafter referred to as "acid generator"). Regarding the chemically amplification type resist, a resist comprising a resin having a t-butyl ester group of a carboxylic acid or a t-butyl carbonate group of phenol, and an acid generator is suggested. This resist makes use of the following phenomenon: an acid generated by exposure functions so as to dissociate the t-butyl ester group or t-butyl carbonate group present in the resin, and thus the resin comes to have an acid group that is a carboxyl group or a phenolic hydroxyl group so that an exposed area of the photoresist film turns easily-soluble in an alkaline developer.

In such lithography, the formation of a finer pattern is required for the future. Investigations on fine processing using an ArF excimer laser (wavelength: 193 nm) are particularly becoming active.

A radiation used ordinarily in lithographic process is a single-wavelength ray, thus an incident radiation and a reflected radiation on the upper and lower interfaces of a photoresist film interfere with each other in the photoresist film. As a result, a phenomenon called "standing wave effect" or "multi-interferential effect", that is, a phenomenon that even when the dose of exposure is constant, a fluctuation in the thickness of the photoresist film causes a fluctuation in effective exposure dose to the photoresist film on the basis of mutual interfere between the radiations in the film, is generated. This is caused a problem that a bad effect is produced onto the formation of a resist pattern. For example, in the case where the thickness of an applied resist film is varied in accordance with a slight variation of the composition and viscosity of the resist, application conditions of the resist or others, and in the case where the thickness of the resist film applied on the substrate is made uneven due to difference in level of a substrate (the thickness at a concave part becomes larger than that of a convex part), an effective exposure dose to the photoresist film is varied by the film thickness difference, so that the dimension of an obtained pattern fluctuates, or the dimension precision of the resist pattern lowers. Such problems about the standing wave effect become serious particularly in an ion implantation process, wherein a used substrate gives a large reflectivity. Thus, it is desired to overcome the problems.

In order to solve the problems about the standing wave effect, a method has been hitherto suggested wherein an upper antireflective film is formed on a photoresist film to restrain reflection on the surface of the photoresist film and reduce multi-interfere in the film. For example, Non-patent document 1 discloses a technique in which an upper antireflective film comprising a polysiloxane, a polyethylvinylether, a polyvinylalcohol or the like is laminated on a photoresist film to reduce the standing wave effect. It is described that: in this case, the reflection-restraining effect on the photoresist film surface depends mainly on the refractive index and the thickness of the antireflective film; the refractive index of the upper antireflective film is ideally $\sqrt{n}$ wherein n is the refractive index of the resist, and the thickness of the upper antireflective film is ideally an odd multiple of $\lambda/4$ m wherein $\lambda$ is the wavelength of a radiation, and m is the refractive index of the upper antireflective film.

[Non-Patent Document 1] J. Electrochem. Soc., Vol. 137, No. 12, P. 3900 (1990)

The refractive index of a resists is generally in the range from 1.6 to 1.8. Therefore, an upper antireflective film having a refractive index of 1.4 or less is required in order to restrain the standing wave effect sufficiently. The refractive index of an upper antireflective film comprising a polysiloxane, a polyethylvinylether or a polyvinyl alcohol is generally 1.5 or more, however, the standing wave effect cannot be sufficiently restrained. When the processing size becomes finer in lithography so that the control of the line width of a pattern is stricter in the future, an upper antireflective film having a smaller refractive index will become necessary.

Additionally, an upper antireflective film is required to have a high transmittance as well as a small refractive index. This is because: when an upper antireflective film has an intensely absorptive band, light reaching the resist film becomes weak to cause a problem that the sensitivity is declined so that the throughput falls. It is therefore preferred that the absorption coefficient (k value) of the upper antireflective film is small. It can be mentioned that the absorption coefficient is practically 0.25 or less.

Further, a lithographic process for the production of an integrated circuit element in recent years has a problem of defects generated when a resist film is developed. Examples of the defect include a bridge defect and a scum in line and space patterns, a poor openings defect and a scum in contact hole patterns, and the like. A cause for these defects is that a material hardly soluble in a developer adheres again onto the resist or the substrate at the time of rinsing after development. This defect is called a blob defect.

If the blob defect can be overcome, the yield of an integrated circuit element is improved in production of the element. Thus, many investigations have been made hitherto. However, a method for solving the defect sufficiently has not yet been found out.

DISCLOSURE OF THE INVENTION

Problems that the Invention is to Solve

The present invention is completed based on the above-mentioned circumstances and an objective of the present invention is to provide a resin for formation of an upper antireflective film, a composition for formation of an upper antireflective film and a resist pattern formation method. More specifically, the present invention relates to a resin for formation of an upper antireflective film and a composition for formation of an upper antireflective film that can reduce a standing wave effect satisfactorily and lead excellent solubility in an alkaline developer in lithography (193-nm lithography in particular) and a method for forming a resist pattern. Additionally, other objective of the present invention is to provide a composition for formation of an upper antireflective film that can reduce a standing wave effect and blob defects satisfactorily and lead excellent solubility in an alkaline developer in lithography (193-nm lithography in particular) and a method for forming a resist pattern.

Means for Solving the Problems

Means for solving the above-mentioned objective are as follows.

[1] A resin for forming an upper antireflective film characterized in that the resin comprises at least one unit selected from the group consisting of a repeating unit represented by the following formula (1) and a repeating unit represented by the following formula (2), has a weight average molecular weight in the range from 1,000 to 100,000, the molecular weight being measured by gel permeation chromatography, and is soluble in an alkaline developer.

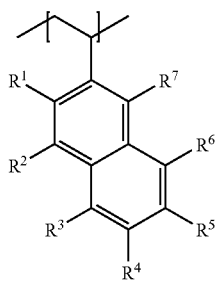
(1)

[In the formula (1), $R^1$ to $R^7$ are each independently a hydrogen atom, —OH, —COOH or —SO$_3$H, provided that all of $R^1$ to $R^7$ do not represent a hydrogen atom in a molecule.]

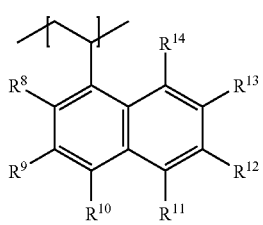
(2)

[In the formula (2), $R^8$ to $R^{14}$ are each independently a hydrogen atom, —OH, —COOH or —SO$_3$H, provided that all of $R^8$ to $R^{14}$ do not represent a hydrogen atom in a molecule.]

[2] The resin for forming an upper antireflective film according to [1] above, comprising a repeating unit that has at least one group selected from the group consisting of —OH, —COOH and —SO$_3$H, and is other than the repeating units (1) and (2).

[3] The resin for forming an upper antireflective film according to [1] above, further comprising at least one unit selected from the group consisting of repeating units represented by the following formulae (3) to (6).

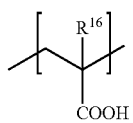
(3)

[In the formula (3), $R^{15}$ represents a hydrogen atom, a methyl group, a hydroxymethyl group or a trifluoromethyl group, A represents a single bond, a carbonyl group or a carbonyloxy group, B represents a single bond or an imino group, and D represents a single bond or a bivalent organic group having carbon atoms of 1 to 12.]

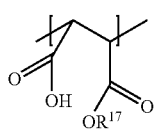
(4)

[In the formula (4), $R^{16}$ represents a hydrogen atom, a methyl group, a hydroxymethyl group or a trifluoromethyl group.]

(5)

[In the formula (5), $R^{17}$ represents a hydrogen atom, an alkyl group having carbon atoms of 1 to 12, or a fluorinated alkyl group having carbon atoms of 1 to 12.]

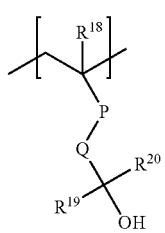
(6)

[In the formula (6), $R^{18}$ represents a hydrogen atom, a methyl group, a hydroxymethyl group or a trifluoromethyl group, P represents a single bond, a carbonyl group or a carbonyloxy group, Q represents a single bond or a bivalent organic group having carbon atoms of 1 to 21, and $R^{19}$ and $R^{20}$ each independently represent a hydrogen atom, an alkyl group having carbon atoms of 1 to 4, or a fluorinated alkyl group having carbon atoms of 1 to 4.]

[4] A composition for forming an upper antireflective film characterized by comprising the resin for forming an upper antireflective film as recited in any one of [1] to [3] above, and a solvent.

[5] A method for forming a resist pattern characterized by comprising:
(1) a process for forming a photoresist film on a substrate;
(2) a process for forming an upper antireflective film on the photoresist film, using the composition for forming an upper antireflective film as recited in [4] above;
(3) a process for irradiating a predetermined region of the photoresist film on which the upper antireflective film is formed with a radiation, thereby performing exposure; and
(4) a process for developing the resultant to remove the upper antireflective film.

[6] A composition for forming an upper antireflective film characterized by comprising a polymer (A) that is soluble in an alkaline developer and has an aromatic group, and at least one component selected from the group consisting of a photosensitive acid generator (B) and a compound (C) having a sulfonic acid residue.

[7] The composition for forming an upper antireflective film according to [6] above, wherein the compound (C) having a sulfonic acid residue is a compound represented by the following (I).

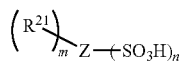
(I)

[In the formula (I), $R^{21}$ represents a linear or branched alkyl group having carbon atoms of 1 to 10, an alicyclic alkyl group having carbon atoms of 3 to 20 or a derivative thereof, a hydroxyl group, a carboxyl group, an alkylether group, an alkyloxycarbonyl group or an alkylcarbonyloxy group, Z represents a linear, branched or alicyclic hydrocarbon group, having carbon atoms of 4 to 12, or an aromatic hydrocarbon group which may have a substituent, m is an integer of 0 to 4, and n is an integer of 1 to 4. When plural $R^1$s are present, they may be the same or different from each other.]

[8] The composition for forming an upper antireflective film according to [6] or [7] above, wherein the polymer (A) comprises at least one unit selected from the group consisting of a repeating unit represented by the following formula (II) and a repeating unit represented by the following formula (III), and has a weight average molecular weight in the range from 1,000 to 100,000, the molecular weight being measured by gel permeation chromatography.

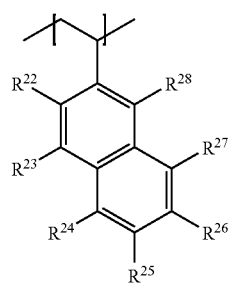
(II)

[In the formula (II), $R^{22}$ to $R^{28}$ are each independently a hydrogen atom, —OH, —COOH or —SO$_3$H.]

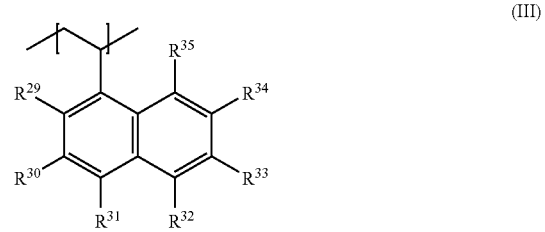
(III)

[In the formula (III), $R^{29}$ to $R^{35}$ are each independently a hydrogen atom, —OH, —COOH or —SO$_3$H.]

[9] The composition for forming an upper antireflective film according to [8] above, wherein the polymer (A) further comprises at least one unit selected from the group consisting of repeating units represented by the following formulae (IV) to (VII).

(IV)

[In the formula (IV), $R^{36}$ represents a hydrogen atom, a methyl group, a hydroxymethyl group or a trifluoromethyl group, A represents a single bond, a carbonyl group or a carbonyloxy group, B represents a single bond or an imino group, and D represents a single bond, a linear, branched or alicyclic hydrocarbon group having carbon atoms of 1 to 20, or an aromatic hydrocarbon group which may have a substituent.]

(V)

[In the formula (V), $R^{37}$ represents a hydrogen atom, a methyl group, a hydroxymethyl group or a trifluoromethyl group.]

(VI)

[In the formula (VI), $R^{38}$ represents a hydrogen atom, an alkyl group having carbon atoms of 1 to 12, or a fluorinated alkyl group having carbon atoms of 1 to 12.]

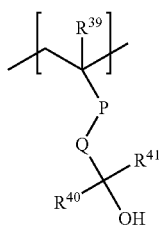

(VII)

[In the formula (VII), $R^{39}$ represents a hydrogen atom, a methyl group, a hydroxymethyl group or a trifluoromethyl group, P represents a single bond, a carbonyl group or a carbonyloxy group, Q represents a single bond, a linear, branched or alicyclic hydrocarbon group having carbon atoms of 1 to 20, or an aromatic hydrocarbon group which may have a substituent, and $R^{40}$ and $R^{41}$ each independently represent a hydrogen atom, an alkyl group having carbon atoms of 1 to 4 or a fluorinated alkyl group having carbon atoms of 1 to 4.]

[10] The composition for forming an upper antireflective film according to any one of [6] to [9] above, wherein the polymer (A) comprises a repeating unit represented by the following formula (VIII) and a repeating unit represented by the following formula (IX).

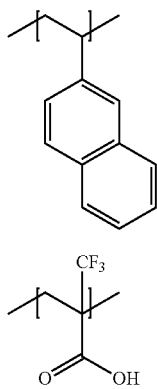

(VIII)

(IX)

[11] A method for forming a resist pattern characterized by comprising:
(1) a process for forming a photoresist film on a substrate;
(2) a process for forming an upper antireflective film on the photoresist film, using the composition for forming an upper antireflective film as recited in any one of [6] to [10] above;
(3) a process for irradiating a predetermined region of the photoresist film on which the upper antireflective film is formed with a radiation, thereby performing exposure; and
(4) a process for developing the resultant to remove the upper antireflective film.

Effects of the Invention

According to the present invention, it is possible to form an upper antireflective film which can reduce a standing wave effect satisfactorily and lead excellent solubility in an alkaline developer in lithography (193-nm lithography in particular). Further, it is possible to form an upper antireflective film which can reduce a standing wave effect and blob defects satisfactorily and lead excellent solubility in an alkaline developer in lithography (193-nm lithography in particular).

Accordingly, the present invention can be used very suitably for the production of LSIs, which will be becoming still finer in the future. Moreover, the present invention can be used suitably in an ion implantation process particularly in 193-nm lithography.

BRIEF DESCRIPTION OF THE DRAWINGS

FIG. 1 is a schematic view showing a cross-sectional shape of a pattern.

DESCRIPTION OF THE PREFERRED EMBODIMENTS

The embodiment modes of the present invention will be described in greater detail. It is noted that in this specification "(meth)acryl" means acryl and methacryl.

[1] Resin for Formation of Upper Antireflective Film

The resin for formation of an upper antireflective film of the present invention is characterized in that the resin comprises at least one unit selected from the group consisting of a repeating unit represented by the following formula (1) (referred to as "repeating unit (1)") and a repeating unit represented by the following formula (2) (referred to as "repeating unit (2)"), and is soluble in an alkaline developer.

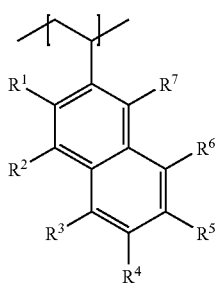

(1)

[In the formula (1), $R^1$ to $R^7$ are each independently a hydrogen atom, —OH, —COOH or —$SO_3H$, provided that all of $R^1$ to $R^7$ do not represent a hydrogen atom in a molecule.]

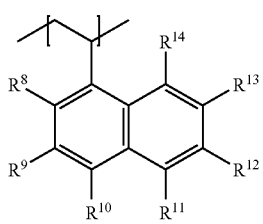

(2)

[In the formula (2), $R^8$ to $R^{14}$ are each independently a hydrogen atom, —OH, —COOH or —$SO_3H$, provided that all of $R^8$ to $R^{14}$ do not represent a hydrogen atom in a molecule.]

In the present invention, each of the repeating units (1) and (2) contained in the resin for formation of an upper antireflective film may be of only one type or may be of two or more types.

Additionally, the resin for formation of an upper antireflective film of the present invention may comprise a repeating unit containing at least one group selected from the group consisting of —OH, —COOH and —$SO_3H$ for the purpose of promoting the solubility in an alkaline developer in addition to the above-mentioned repeating units (1) and (2). Specific examples of the repeating unit include repeating units represented by the formulae (3), (4), (5) and (6), which will be referred to as "repeating unit (3)", "repeating unit (4)", "repeating unit (5)" and "repeating unit (6)", respectively. In the present invention, at least one type selected from the group consisting of these repeating units (3) to (6) is preferably contained.

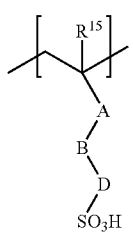

(3)

[In the formula (3), $R^{15}$ represents a hydrogen atom, a methyl group, a hydroxymethyl group or a trifluoromethyl group, A represents a single bond, a carbonyl group or a carbonyloxy group, B represents a single bond or an imino group, and D represents a single bond or a bivalent organic group having carbon atoms of 1 to 12.]

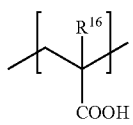

(4)

[In the formula (4), $R^{16}$ represents a hydrogen atom, methyl group, hydroxymethyl group or trifluoromethyl group.]

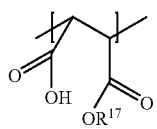

(5)

[In the formula (5), $R^{17}$ represents a hydrogen atom, an alkyl group having carbon atoms of 1 to 12 or a fluorinated alkyl group having carbon atoms of 1 to 12.]

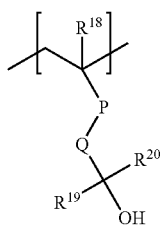

(6)

[In the formula (6), $R^{18}$ represents a hydrogen atom, a methyl group, a hydroxymethyl group or a trifluoromethyl group, P represents a single bond, a carbonyl group or a carbonyloxy group, Q represents a single bond or a bivalent organic group having carbon atoms of 1 to 21, and $R^{19}$ and $R^{20}$ each independently represent a hydrogen atom, an alkyl group having carbon atoms of 1 to 4, or a fluorinated alkyl group having carbon atoms of 1 to 4.]

Examples of the bivalent organic group having carbon atoms of 1 to 12 for D in the above-mentioned formula (3) include methylene group, 1,2-ethylene group, 1,2-propylene group, 1,1-dimethyl-1,2-ethylene group, 1,3-propylene group, 1-methyl-1,3-propylene group, 2-methyl-1,3-propylene group, 1,4-butylene group, 1-methyl-1,4-butylene group, 2-methyl-1,4-butylene group, 1,5-pentylene group, 1,1-dimethyl-1,4-butylene group, 2,2-dimethyl-1,4-butylene group, 1,2-dimethyl-1,4-butylene group, 1,6-hexlene group, 1,3-cyclopentylene group, 1,4-cyclohexylene group and the like.

In addition, preferable example of a monomer providing the repeating unit (3) represented by the above-mentioned formula (3) includes vinylsulfonic acid, allylsulfonic acid, 1-sulfoxyethyl (meth) acrylate, 4-vinyl-1-benzenesulfonic acid, 2-acrylamide-2-methylpropanesulfonic acid and the like.

Further, preferable example of a monomer providing the repeating unit (4) represented by the above-mentioned formula (4) includes (meth)acrylic acid, α-trifluoromethyl acrylic acid and the like.

Examples of the alkyl group having carbon atoms of 1 to 12 as $R^{17}$ in the above-mentioned formula (5) include a linear and branched alkyl groups such as methyl group, ethyl group, n-propyl group, i-propyl group, n-butyl group, 2-methylpropyl group, 1-methylpropyl group, t-butyl group, n-pentyl group, neopentyl group, n-hexyl group, n-heptyl group, n-octyl group, 2-ethylhexyl group, n-nonyl group and n-decyl group; a cycloalkyl group such as cyclobutyl group, cyclopentyl group, cyclohexyl group, cycloheptyl group and cyclooctyl group; an alicyclic hydrocarbon group such as bicyclo[2.2.1]heptane-2-yl group, bicyclo[2.2.2]octane-2-yl group, adamantane-1-yl group and adamantane-2-yl group; and the like.

Further, examples of the fluorinated alkyl group having carbon atoms of 1 to 12 as $R^{17}$ include a group in which a part or all of hydrogen atom in the alkyl group having carbon atoms of 1 to 12 is/are substituted with a fluorine atom.

Examples of the bivalent organic group having carbon atoms of 1 to 12 for Q in the above-mentioned formula (6) include methylene group, 1,2-ethylene group, 1,2-propylene group, 1,1-dimethyl-1,2-ethylene group, 1,3-propylene group, 1-methyl-1,3-propylene group, 2-methyl-1,3-propylene group, 1,4-butylene group, 1-methyl-1,4-butylene group, 2-methyl-1,4-butylene group, 1,5-pentylene group, 1,1-dimethyl-1,4-butylene group, 2,2-dimethyl-1,4-butylene group, 1,2-dimethyl-1,4-butylene group, 1,6-hexlene group, 1,3-cyclopentylene group, 1,4-cyclohexylene group and the like.

In addition, examples of the alkyl group having carbon atoms of 1 to 4 as $R^{19}$ and $R^{20}$ in the above-mentioned formula (6) include methyl group, ethyl group, n-propyl group, i-propyl group, n-butyl group, 2-methylpropyl group, 1-methylpropyl group, t-butyl group and the like.

Further, examples of the fluorinated alkyl group having carbon atoms of 1 to 4 as $R^{19}$ and $R^{20}$ include a group in which a part or all of hydrogen atom in the alkyl group having carbon atoms of 1 to 4 is/are substituted with a fluorine atom.

$R^{19}$ and $R^{20}$ are the same or different from each other.

Moreover, preferable example of a monomer providing the repeating unit (6) represented by the above-mentioned formula (6) includes (1,1,1-trifluoro-2-trifluoromethyl-2-hydroxy-3-propyl)(meth)acrylate, (1,1,1-trifluoro-2-trifluoromethyl-2-hydroxy-4-butyl)(meth)acrylate, (1,1,1- trifluoro-2-trifluoromethyl-2-hydroxy-5-pentyl)(meth) acrylate, (1,1,1-trifluoro-2-trifluoromethyl-2-hydroxy-4-pentyl)(meth)acrylate, 2-{[5-(1',1',1'-trifluoro-2'-trifluoromethyl-2'-hydroxy)propyl]bicyclo[2.2.1]heptyl}(meth)acrylate, 3-{[8-(1',1',1'-trifluoro-2'-trifluoromethyl-2'-hydroxy)propyl]tetracyclo[6.2.1.1$^{3,6}$.0$^{2,7}$]dodecyl}(meth)acrylate and the like.

The resin for formation of an upper antireflective film of the present invention may comprise a repeating unit represented by the following formula (7-1) or (7-2) (hereinafter, referred to also as "repeating unit (7)") in addition to the above-mentioned repeating units (1) to (6).

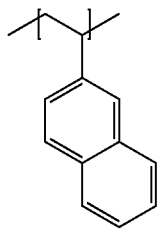
(7-1)

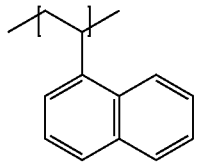
(7-2)

In the case where the resin for formation of an upper antireflective film comprises the repeating unit (7), the standing wave effect exhibiting as an antireflective film can be sufficiently reduced, being favorable.

The above-mentioned resin for formation of an upper antireflective film may comprise both of the repeating unit represented by the formula (7-1) and that represented by the formula (7-2).

In the resin for formation of an upper antireflective film of the present invention, the total of contents of the above-mentioned repeating units (1) and (2) is not particularly limited and is preferably in the range from 20% to 80% by mole, more preferably from 30% to 70% by mole, and further preferably from 40% to 60% by mole based on 100% by mole of the total of repeating units constituting the resin. When the content ratio is in the range from 20% to 80% by mole, the standing wave effect exhibiting as an antireflective film can be sufficiently reduced and further the resin has a sufficient transmittance at a wavelength of 193 nm. Thus, an excellent pattern can be obtained and further an enhancement in sensitivity can be restrained.

Additionally, the total content of the repeating units (3) to (6), which are for promoting the above-mentioned solubility in an alkaline developer, is not particularly limited, and is preferably in the range from 20% to 80% by mole, more preferably from 30% to 70% by mole, and further preferably from 40% to 60% by mole based on 100% by mole of the total amount of all the repeating units constituting this resin. When the content ratio is in the range from 20% to 80% by mole, a sufficient solubility in a developer can be obtained. Thus, when the resin is developed, the resin remaining without being dissolved and the generation of a scum can be restrained.

The content of the above-mentioned repeating unit (7) is not particularly limited, and is preferably in the range from 10% to 60% by mole, more preferably from 20% to 50% by mole, and further preferably from 30% to 50% by mole based on 100% by mole of the total amount of all the repeating units constituting this resin. When the content is in the range from 10% to 60% by mole, the standing wave effect exhibiting as an antireflective film can be sufficiently reduced.

Additionally, the polystyrene-reduced weight average molecular weight determined by gel permeation chromatography (GPC) (hereinafter referred to as "Mw") of the resin for formation of an upper antireflective film of the present invention is in the range from 1,000 to 100,000, preferably 1,500 to 10,000, and more preferably 2,000 to 7,000. If the Mw is less than 1,000, the film formability may be insufficient. On the other hand, if the Mw is more than 100,000, a sufficient dissolving speed in a developer is not obtained so that the resin may remain without being dissolved or a scum may be generated.

Further, the resin for formation of an upper antireflective film of the invention can be produced, for example, by polymerization of polymerizable unsaturated monomers corresponding to the individual repeating units constituting the resin in an appropriate solvent in the presence of a radical polymerization initiator such as a hydroperoxide, a dialkylperoxide, a diacylperoxide and an azo compound, and optionally in the presence of a chain transfer agent.

Examples of the solvent used for the above-mentioned polymerization include an alkane such as n-pentane, n-hexane, n-heptane, n-octane, n-nonane and n-decane; a cycloalkane such as cyclohexane, cycloheptane, cyclooctane, decalin and norbornane; an aromatic hydrocarbon such as benzene, toluene, xylene, ethylbenzene and cumene; a halogenated hydrocarbon such as chlorobutanes, bromohexanes, dichloroethanes, hexamethylene dibromide and chlorobenzene; a saturated carboxylic acid ester such as ethyl acetate, n-butyl acetate, i-butyl acetate and methyl propionate; a ketone such as acetone, 2-butanone, 4-methyl-2-pentanone and 2-heptanone; an ether such as tetrahydrofuran, dimethoxyethanes and diethoxyethanes; and the like. These solvents may be used singly or in combination of two or more types thereof.

The reaction temperature for the above-mentioned polymerization is usually in the range from 40° C. to 120° C., and preferably from 50° C. to 100° C. The reaction time is usually in the range from 1 to 24 hours, and preferably from 3 to 12 hours.

[2] Composition for Formation of Upper Antireflective Film (I)

The composition for formation of an upper antireflective film (I) of the present invention is characterized by comprising a resin for formation of an upper antireflective film and a solvent.

The above-mentioned "resin for formation of an upper antireflective film" can have the explanation on the resin described above as it is. The resin for formation of an upper antireflective film may be used singly or in combination of two or more types thereof.

The above-mentioned "solvent" may be used one in which lithographic performance hardly deteriorates, for example in the case where the solvent undergoes an intermixing with a photoresist film at coating of the composition for formation of an upper antireflective film (I) on the photoresist film.

Examples of the solvent include a monovalent alcohol, a polyvalent alcohol, an alkylether of a polyvalent alcohol, an alkyletheracetate of a polyvalent alcohol, an ether, a cyclic ether, a higher hydrocarbon, an aromatic hydrocarbon, a ketone, an ester, water and the like.

The above-mentioned monovalent alcohol is preferably a monovalent alcohol having carbon atoms of 4 to 8. Specific example thereof includes 2-methyl-1-propanol, 1-butanol, 2-butanol, 1-pentanol, 2-pentanol, 3-pentanol, 3-methyl-2-pentanol, 4-methyl-2-pentanol, 2-ethyl-1-butanol, 2,4-dimethyl-3-pentanol and the like.

Examples of the above-mentioned polyvalent alcohol include ethylene glycol, propylene glycol and the like.

Examples of the above-mentioned alkylether of a polyvalent alcohol include ethylene glycol monomethylether, ethylene glycol monoethylether, ethylene glycol dimethylether, ethylene glycol diethylether, diethylene glycol monomethylether, diethylene glycol monoethylether, diethylene glycol dimethylether, diethylene glycol diethylether, diethylene glycol ethylmethylether, propylene glycol monomethylether, propylene glycol monoethylether and the like.

Examples of the above-mentioned alkyletheracetate include ethylene glycol ethyletheracetate, diethylene glycol ethyletheracetate, propylene glycol ethyletheracetate, propylene glycol monomethyletheracetate and the like.

Examples of the above-mentioned ether include dipropylether, diisopropylether, butylmethylether, butylethylether, butylpropylether, dibutylether, diisobutylether, tert-butylmethylether, tert-butyl-ethylether, tert-butyl-propylether, di-tert-butylether, dipentylether, diisoamylether, cyclopentylmethylether, cyclohexylmethylether, cyclopentylethylether, cyclohexylethylether, cyclopentylpropylether, cyclopentyl-2-propylether, cyclohexylpropylether, cyclohexyl-2-propylether, cyclopentylbutylether, cyclopentyl-tert-butylether, cyclohexylbutylether, cyclohexyl-tert-butylether and the like.

Examples of the above-mentioned cyclic ether include tetrahydrofuran, dioxane and the like.

Examples of the above-mentioned higher hydrocarbon include decane, dodecane, undecane and the like.

Examples of the above-mentioned aromatic hydrocarbon include benzene, toluene, xylene and the like.

Examples of the above-mentioned ketone include acetone, methyl ethyl ketone, methyl isobutyl ketone, cyclohexanone, 4-hydroxy-4-methyl-2-pentanone, diacetone alcohol and the like.

Examples of the above-mentioned ester include ethyl acetate, butyl acetate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutyrate, methyl 3-methoxypropionate, ethyl 3-methyoxypropionate, ethyl 3-ethyoxypropionate, methyl 3-ethyoxypropionate and the like.

Among these, a monovalent alcohol, an ether, a cyclic ether, an alkylether of a polyvalent alcohol, an alkyletheracetate of a polyvalent alcohol and a higher hydrocarbon are preferred.

The solvent may be used singly or in combination of two or more types thereof.

Additionally, a surfactant may be further incorporated into the composition for formation of an upper antireflective film (I) of the present invention for the purpose of improving the coatability, defoamability, leveling performance and the like.

As the above-mentioned surfactant, a fluorine-based surfactant including commercial products such as "BM-1000" and "BM-1100" manufactured by BM-Chemie, "Megafak F142D", "Megafak F172", "Megafak F173" and "Megafak F183" manufactured by Dainippon ink and chemicals Inc., "Fluorad FC-135", "Fluorad FC-170C", "Fluorad FC-430" and "Fluorad FC-431" manufactured by Sumitomo 3M Ltd., "Surfron S-112", "Surfron S-113", "Surfron S-131" and "Surfron S-141" manufactured by Asahi glass Co., Ltd., "SH-28PA", "SH-190", "SH-193", "SZ-6032" and "SF8428" manufactured by Dow Corning Toray Co., Ltd., and "EMULGEN A-60", "EMULGEN 104P" and "EMULGEN 306P" manufactured by Kao Corp.

The surfactant may be used singly or in combination of two or more types thereof.

Additionally, the formulating amount of the surfactant is preferably 5 parts or less by weight based on 100 parts by weight of the resin for formation of an upper antireflective film.

In the present invention, the composition (I) for formation of an upper antireflective film is preferably a composition prepared by dissolving the above-mentioned resin for formation of an upper antireflective film and others into the above-mentioned solvent so as to give, for example, a solid concentration in the range from 0.1% to 15% by weight (preferably from 0.1% to 10% by weight), and then filtrating with a filter having a pore diameter of, for example, about 20 nm.

Additionally, the refractive index (n value) at a wavelength of 193 nm for a film obtained using the present composition (I) for formation of an upper antireflective film is preferably 1.5 or less, more preferably in the range from 1.25 to 1.45, and further preferably from 1.25 to 1.4. When the refractive index is 1.5 or less, the reflection of light in a laminate to be yielded is restrained so that the standing wave effect can be reduced, being favorable.

The refractive index can be measured with an ellipsometer after coating the composition (I) for formation of an upper antireflective film onto a silicon wafer having a diameter of 8 inches.

[3] Formation Method of Resist Pattern (I)

The formation method of a resist pattern (I) is characterized by comprising:

(1) a process for forming a photoresist film on a substrate (hereinafter referred to as "process (1)");

(2) a process for forming an upper antireflective film on the photoresist film, using the above-mentioned composition (I) for forming an upper antireflective film (hereinafter referred to as "process (2)");

(3) a process for irradiating a predetermined region of said photoresist film on which said upper antireflective film is formed with a radiation, thereby performing exposure (hereinafter referred to as "process (3)"); and (4) a process for developing the resultant to remove the upper antireflective film (hereinafter referred to as "process (4)").

In the above-mentioned process (1), a photoresist film is formed on a substrate.

Specifically, a resist composition solution is coated over a substrate in an appropriate coating manner such as spin coating, cast coating and roll coating so as to obtain a photoresist film having a predetermined thickness, and then the resultant is subjected to preliminary firing (hereinafter referred to as "pre-baking") and volatilizing the solvent in the coating film, sequentially. In this way, the photoresist film is formed.

The above-mentioned substrate may be a silicon wafer, a wafer coated with aluminum, and the like. In order to bring out the potential of the resultant photoresist film to the maximum extent, an organic or inorganic antireflection film may be formed in advance on the substrate using a method described in, for example, JP-B H6-12452 or the like.

The above-mentioned resist composition solution is not particularly limited, and may be appropriately selected in accordance with the intended use of the photoresist. A specific example of the resist composition solution is a resist composition solution prepared by dissolving a chemically amplification type resist composition or the like which contains an acid generator or the like in an appropriate solvent so as to give, for example, a solid concentration in the range from 0.1% to 20% by weight and then filtrating with a filter having a pore diameter of, for example, about 30 nm. A commercially available resist solution may be used as it is.

Additionally, the resist composition solution may be of a positive type or of a negative type, and is preferably a positive type resist composition solution. In a chemically amplification positive type resist, an acid generated from the acid generator by exposure leads to a dissociation of an acid-dissociating organic group in the polymer, for example, a carboxyl group is generated. As a result, the solubility of the exposed region of the resist to an alkaline developer becomes high so that the exposed region is dissolved and removed by the alkaline developer. Thus, a positive type resist pattern is obtained.

In the above-mentioned process (2), the composition for formation of an upper antireflective film (I) is used to form an upper antireflective film on the above-mentioned photoresist film. The composition for formation of an upper antireflective film (I) can have the explanation on the composition described above as it is.

Specifically, the composition for formation of an upper antireflective film (I) is coated over the photoresist film in an appropriate coating manner such as spin coating, cast coating and roll coating so as to obtain an upper antireflective film having a predetermined thickness, and then the resultant is subjected to preliminary firing and volatilizing the solvent, sequentially. In this way, the upper antireflective film is formed.

Regarding the thickness of the above-mentioned upper antireflective film, closer is the thickness to an odd multiple of λ/4 m wherein λ represents the wavelength of a radiation, and m represents the refractive index of the upper antireflective film, larger effect in reflection-restraining at an upper surface of the photoresist film can be obtained. It is therefore preferred to make the thickness of the upper antireflective film closer to this value.

In the present invention, any one of the pre-baking after the resist composition solution is coated in the above-mentioned process (1) and the firing after coating of the composition for formation of an upper antireflective film in the above-mentioned process (2) may be omitted in order to make the process simple.

In the above-mentioned process (3), a radiation is emitted to a predetermined region of the photoresist film on which the upper antireflective film is formed, thereby performing exposure.

The radiation is appropriately selected in accordance with the components which constitute the photoresist film, and a combination of the photoresist film with the upper antireflective film. Examples of the radiation include visible rays; ultraviolet rays such as g-lines and i-lines; far ultraviolet rays such as an excimer laser; X-rays such as a synchrotron radiation; charged particle beams such as an electron beam; and various other radiations. Of these rays, an ArF excimer laser (wavelength; 193 nm) and a KrF excimer laser (wavelength; 248 nm) are preferable and preferred is an ArF excimer laser.

Additionally, In order to improve the resolution, pattern shape, developability and the like of the photoresist film, it is preferred that firing (hereinafter, referred to as "PEB") is performed after the exposure. The firing temperature therefor is appropriately adjusted in accordance with the used resist composition, and others. The temperature is usually in the range from about 30° C. to 200° C., and preferably from 50° C. to 150° C.

In the above-mentioned process (4), the upper antireflective film is removed by development.

Specifically, the photoresist film is developed with a developer, and then washed. Thereafter, a desired resist pattern is formed, and further the above-mentioned upper antireflective film is completely removed, without being subjected to any separate peeling process, during the development or during the washing after the development.

Examples of the above-mentioned developer include an alkaline aqueous solution prepared by dissolving sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5.4.0]-7-undecene, 1,5-diazabicyclo-[4.3.0]-5-nonane and the like.

Additionally, appropriate amounts of an aqueous organic solvent such as an alcohol including methanol, ethanol and the like, a surfactant and the like may be added to the developer.

After development using the alkaline aqueous solution, washing with water and drying are generally carried out.

[4] Composition for Formation of Upper Antireflective Film (II)

The composition for formation of an upper antireflective film (II) of the present invention is characterized by comprising a polymer (A) that is soluble in an alkaline developer and has an aromatic group (hereinafter referred to simply as "polymer (A)"), and at least one component selected from the group consisting of a photosensitive acid generator (B) (hereinafter referred to simply as "acid generator (B)") and a compound (C) having a sulfonic acid residue (hereinafter referred to simply as "compound (C)").

In the composition for forming of an upper antireflective film (II) of the present invention, the above-mentioned "polymer (A)" is not particularly limited so long as the polymer leads to the advantageous effects of the invention, is soluble in an alkaline developer, and further has an aromatic group.

Examples of the above-mentioned aromatic group include phenyl group, naphthyl group, acenaphthyl group, thiophenyl group and the like. Among these, naphthyl group and acenaphthyl group are preferred.

The above-mentioned polymer (A) is preferably one that comprises at least one selected from the group consisting of a repeating unit represented by the following formula (II) (hereinafter referred to as "repeating unit (I)") and a repeating unit represented by the following formula (III) (hereinafter referred to as "repeating unit (II)"), and has a weight average molecular weight measured by gel permeation chromatography of 1,000 to 100,000.

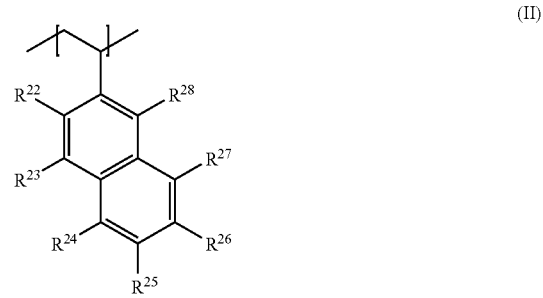

(II)

[In the formula (II), $R^{22}$ to $R^{28}$ are each independently a hydrogen atom, —OH, —COOH or —SO$_3$H.]

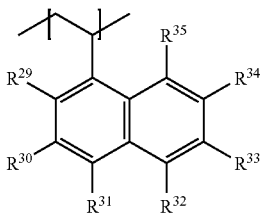
(III)

[In the formula (III), $R^{29}$ to $R^{35}$ are each independently a hydrogen atom, —OH, —COOH or —SO$_3$H.]

Each of the repeating units (I) and (II) contained in the above-mentioned polymer (A) may be of only one type or may be of two or more types.

The above-mentioned polymer (A) may comprise a repeating unit containing at least one type selected from the group consisting of —OH, —COOH and —SO$_3$H in addition to the repeating units (I) and (II) for the purpose of promoting the solubility in an alkaline developer. Specific examples of the repeating unit include repeating units represented by the formulae (IV), (V), (VI) and (VII), which will be referred to as "repeating unit (III)", "repeating unit (IV)", "repeating unit (V)" and "repeating unit (VI)", respectively. In the present invention, at least one type selected from the group consisting of these repeating units (III) to (VI) is preferably contained.

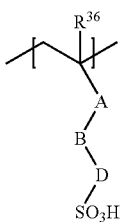
(IV)

[In the formula (IV), $R^{36}$ represents a hydrogen atom, a methyl group, a hydroxymethyl group or a trifluoromethyl group, A represents a single bond, a carbonyl group or a carbonyloxy group, B represents a single bond or an imino group, and D represents a single bond, a linear, branched or alicyclic hydrocarbon group having carbon atoms of 1 to 20, or an aromatic hydrocarbon group which may have a substituent.]

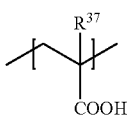
(V)

[In the formula (V), $R^{37}$ represents a hydrogen atom, methyl group, hydroxymethyl group or trifluoromethyl group.]

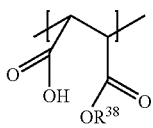
(VI)

[In the formula (VI), $R^{38}$ represents a hydrogen atom, an alkyl group having carbon atoms of 1 to 12 or a fluorinated alkyl group having carbon atoms of 1 to 12.]

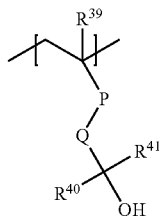
(VII)

[In the formula (VII), $R^{39}$ represents a hydrogen atom, a methyl group, a hydroxymethyl group or a trifluoromethyl group, P represents a single bond, a carbonyl group or a carbonyloxy group, Q represents a single bond, a linear, branched or alicyclic hydrocarbon group having carbon atoms of 1 to 20, or an aromatic hydrocarbon group which may have a substituent, and $R^{40}$ and $R^{41}$ each independently represent a hydrogen atom, an alkyl group having carbon atoms of 1 to 4 or a fluorinated alkyl group having carbon atoms of 1 to 4.]

Examples of the linear, branched or alicyclic hydrocarbon group having carbon atoms of 1 to 20, or the aromatic hydrocarbon group which may have a substituent as D in the above-mentioned formula (IV) include a saturated chain hydrocarbon group such as methylene group, ethylene group, propylene group including 1,3-propylene group and 1,2-propylene group, tetramethylene group, pentamethylene group, hexamethylene group, heptamethylene group, octamethylene group, nonamethylene group, decamethylene group, undecamethylene group, dodecamethylene group, tridecamethylene group, tetradecamethylene group, pentadecamethylene group, hexadecamethylene group, heptadecamethylene group, octadecamethylene group, nonadecamethylene group, 1-methyl-1,3-propylene group, 2-methyl-1,3-propylene group, 2-methyl-1,2-propylene group, 1-methyl-1,4-butylene group, 2-methyl-1,4-butylene group, methylidene group, ethylidene group, propylidene group and 2-propylidene group; a monocyclic hydrocarbon ring group including an arylene group such as phenylene group and tolylene group, a cycloalkylene group having carbon atoms of 3 to 10 such as cyclobutylene group including 1,3-cyclobutylene, a cyclopentylene group including 1,3-cyclopentylene, a cyclohexylene group including 1,4-cyclohexylene group, and a cyclooctylene group including 1,5-cyclooctylene group; a bridged-cyclic hydrocarbon ring group such as a bi-cyclic to tetra-cyclic hydrocarbon ring groups having carbon atoms of 4 to 20 including a norbornylene group such as 1,4-norbornylene group and 2,5-norbornylene group, an adamantylene group such as 1,5-adamantylene group and 2,6-adamantylene group; a substituted or unsubstituted phenylene groups; and the like.

Preferable example of a monomer providing the repeating unit (III) represented by the above-mentioned formula (IV) includes vinylsulfonic acid, allylsulfonic acid, 1-sulfoxyethyl (meth)acrylate, 4-vinyl-1-benzenesulfonic acid, 2-acrylamide-2-methylpropanesulfonic acid and the like.

In addition, preferable example of a monomer providing the repeating unit (IV) represented by the above-mentioned formula (V) includes (meth)acrylic acid, α-trifluoromethyl acrylic acid and the like.

Examples of the alkyl group having carbon atoms of 1 to 12 as $R^{38}$ in the above-mentioned formula (VI) include a linear and branched alkyl groups such as methyl group, ethyl group, n-propyl group, i-propyl group, n-butyl group, 2-methylpropyl group, 1-methylpropyl group, t-butyl group, n-pentyl group, neopentyl group, n-hexyl group, n-heptyl group, n-octyl group, 2-ethylhexyl group, n-nonyl group and n-decyl group; a cycloalkyl group such as cyclobutyl group, cyclopentyl group, cyclohexyl group, cycloheptyl group and cyclooctyl group; an alicyclic hydrocarbon group such as bicyclo[2.2.1]heptane-2-yl group, bicyclo[2.2.2]octane-2-yl group, adamantane-1-yl group and adamantane-2-yl group; and the like.

Additionally, examples of the fluorinated alkyl group having carbon atoms of 1 to 12 as $R^{38}$ include a group in which a part or all of hydrogen atom in the above-mentioned alkyl group having carbon atoms of 1 to 12 is/are substituted with a fluorine atom.

Examples of the linear, branched or alicyclic hydrocarbon group having carbon atoms of 1 to 20, or the aromatic hydrocarbon group which may have a substituent as Q in the above-mentioned formula (VII) include a saturated chain hydrocarbon group such as methylene group, ethylene group, propylene group including 1,3-propylene group and 1,2-propylene group, tetramethylene group, pentamethylene group, hexamethylene group, heptamethylene group, octamethylene group, nonamethylene group, decamethylene group, undecamethylene group, dodecamethylene group, tridecamethylene group, tetradecamethylene group, pentadecamethylene group, hexadecamethylene group, heptadecamethylene group, octadecamethylene group, nonadecamethylene group, 1-methyl-1,3-propylene group, 2-methyl-1,3-propylene group, 2-methyl-1,2-propylene group, 1-methyl-1,4-butylene group, 2-methyl-1,4-butylene group, methylidene group, ethylidene group, propylidene group and 2-propylidene group; a monocyclic hydrocarbon ring group such as a cycloalkylene group having carbon atoms of 3 to 10 including an arylene group such as phenylene group and tolylene group, a cyclobutylene group such as 1,3-cyclobutylene, a cyclopentylene group such as 1,3-cyclopentylene, a cyclohexylene group such as 1,4-cyclohexylene group, and a cyclooctylene group such as 1,5-cyclooctylene group; a bridged-cyclic hydrocarbon ring group such as a bi-cyclic to tetra-cyclic hydrocarbon ring groups having carbon atoms of 4 to 20 including a norbornylene group such as 1,4-norbornylene group and 2,5-norbornylene group, an adamantylene group such as 1,5-adamantylene group and 2,6-adamantylene group; a substituted or unsubstituted phenylene groups; and the like.

Examples of the alkyl group having carbon atoms of 1 to 4 as $R^{40}$ and $R^{41}$ in the above-mentioned formula (VII) include methyl group, ethyl group, n-propyl group, i-propyl group, n-butyl group and the like.

Additionally, examples of the fluorinated alkyl group having carbon atoms of 1 to 4 as $R^{40}$ and $R^{41}$ include a group in which a part or all of hydrogen atom in the above-mentioned alkyl group having carbon atoms of 1 to 4 is/are substituted with a fluorine atom.

$R^{40}$ and $R^{41}$ may be the same or different from each other.

Further, preferable examples of the monomer providing the repeating unit (VI) represented by the above-mentioned formula (VII) include (1,1,1-trifluoro-2-trifluoromethyl-2-hydroxy-3-propyl)(meth)acrylate, (1,1,1-trifluoro-2-trifluoromethyl-2-hydroxy-4-butyl)(meth)acrylate, (1,1,1-trifluoro-2-trifluoromethyl-2-hydroxy-5-pentyl)(meth)acrylate, (1,1,1-trifluoro-2-trifluoromethyl-2-hydroxy-4-pentyl)(meth)acrylate, 2-{[5-(1',1',1'-trifluoro-2'-trifluoromethyl-2'-hydroxy)propyl]bicyclo[2.2.1]heptyl}(meth)acrylate, 3-{[8-(1',1',1'-trifluoro-2'-trifluoromethyl-2'-hydroxy)propyl]tetracyclo[6.2.1.1$^{3,6}$.0$^{2,7}$]dodecyl}(meth)acrylate and the like.

In particular, the above-mentioned polymer (A) preferably comprises at least a repeating unit represented by the following formula (VIII) and a repeating unit represented by the following formula (IX). In this case, the standing wave effect exhibiting as an antireflective film can be further reduced and the solubility in an alkaline developer can also be improved.

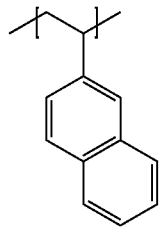

(VIII)

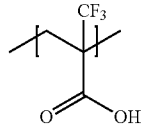

(IX)

Additionally, in the above-mentioned polymer (A), the total of contents of the above-mentioned repeating units (I) and (II) is not particularly limited and is preferably in the range from 20% to 80% by mole, more preferably from 30% to 70% by mole, and further preferably from 40% to 60% by mole based on 100% by mole of the total of repeating units constituting the polymer (A). When the content ratio is in the range from 20% to 80% by mole, the standing wave effect exhibiting as an antireflective film can be sufficiently reduced and further the polymer has a sufficient transmittance at a wavelength of 193 nm. Thus, an excellent pattern can be obtained and further an enhancement in sensitivity can be restrained.

Additionally, the total content of the repeating units (III) to (IV), which are for promoting the above-mentioned solubility in an alkaline developer, is not particularly limited. It is preferably in the range from 20% to 80% by mole, more preferably from 30% to 70% by mole, and further preferably from 40% to 60% by mole based on 100% by mole of the total amount of all the repeating units constituting this polymer (A). When the content ratio is in the range from 20% to 80% by mole, a sufficient solubility in a developer can be obtained. Thus, when the resin is developed, the resin remaining without being dissolved and the generation of a scum can be restrained.

Additionally, the polystyrene-reduced weight average molecular weight determined by gel permeation chromatography (GPC) (hereinafter referred to as "Mw") of the above-mentioned polymer (A) is in the range from 1,000 to 100,000, preferably 1,500 to 10,000, and more preferably 2,000 to 7,000. If the Mw is less than 1,000, the film formability may be insufficient. On the other hand, if the Mw is more than 100,000, a sufficient dissolving speed in a developer is not obtained so that the resin may remain without being dissolved or a scum may be generated.

Further, the above-mentioned polymer (A) can be produced, for example, by polymerization of polymerizable unsaturated monomers corresponding to the individual repeating units constituting the resin in an appropriate solvent in the presence of a radical polymerization initiator such as a hydroperoxide, a dialkylperoxide, a diacylperoxide and an azo compound, and optionally in the presence of a chain transfer agent.

Examples of the solvent used for the above-mentioned polymerization include an alkane such as n-pentane, n-hexane, n-heptane, n-octane, n-nonane and n-decane; a cycloalkane such as cyclohexane, cycloheptane, cyclooctane, decalin and norbornane; an aromatic hydrocarbon such as benzene, toluene, xylene, ethylbenzene and cumene; a halogenated hydrocarbon such as chlorobutanes, bromohexanes, dichloroethanes, hexamethylene dibromide and chlorobenzene; a saturated carboxylic acid ester such as ethyl acetate, n-butyl acetate, i-butyl acetate and methyl propionate; a ketone such as acetone, 2-butanone, 4-methyl-2-pentanone and 2-heptanone; an ether such as tetrahydrofuran, dimethoxyethanes and diethoxyethanes; and the like. These solvents may be used singly or in combination of two or more types thereof.

The reaction temperature for the above-mentioned polymerization is usually in the range from 40° C. to 120° C., and preferably from 50° C. to 100° C. The reaction time is usually in the range from 1 to 24 hours, and preferably from 3 to 12 hours.

In addition, the above-mentioned "acid generator (B)" according to the composition for formation of an upper anti-reflective film (II) of the present invention is a substance that is exposed to a radiation such as visible rays, ultraviolet rays, far ultraviolet rays, an electron beam and X-rays, thereby generating an acid. Examples of this acid generator (B) include an onium salt compound, a halogen-containing compound, a sulfone compound, a sulfonic acid ester compound, a quinone diazide compound and the like.

Specific examples of the acid generator (B) include triphenylsulfonium trifluoromethanesulfonate, triphenylsulfonium nonafluoro-n-butanesulfonate, triphenylsulfonium perfluoro-n-octanesulfonate, triphenylsulfonium 2-bicyclo[2.2.1]hept-2-yl-1,1,2,2-tetrafluoroethanesulfonate, triphenylsulfonium 2-(3-tetracyclo[4.4.0.1$^{2,5}$.1$^{7,10}$]dodecanyl)-1,1-difluoroethanesulfonate, triphenylsulfonium N,N-bis(nonafluoro-n-butanesulfonyl)imidate, triphenylsulfonium camphorsulfonate,
4-cyclohexylphenyldiphenylsulfonium trifluoromethanesulfonate, 4-cyclohexylphenyldiphenylsulfonium nonafluoro-n-butanesulfonate, 4-cyclohexylphenyldiphenylsulfonium perfluoro-n-octanesulfonate, 4-cyclohexylphenyldiphenylsulfonium 2-bicyclo[2.2.1]hept-2-yl-1,1,2,2-tetrafluoroethanesulfonate, 4-cyclohexylphenyldiphenylsulfonium 2-(3-tetracyclo[4.4.0.1$^{2,5}$.1$^{7,10}$]dodecanyl)-1,1-difluoroethanesulfonate, 4-cyclohexylphenyldiphenylsulfonium N,N-bis(nanofluoro-n-butanesulfonyl)imidate, 4-cyclohexylphenyldiphenylsulfonium camphorsulfonate,
4-t-butylphenyldiphenylsulfonium trifluoromethanesulfonate, 4-t-butylphenyldiphenylsulfonium nonafluoro-n-butanesulfonate, 4-t-butylphenyldiphenylsulfonium perfluoro-n-octanesulfonate, 4-t-butylphenyldiphenylsulfonium 2-bicyclo[2.2.1]hept-2-yl-1,1,2,2-tetrafluoroethanesulfonate, 4-t-butylphenyldiphenylsulfonium 2-(3-tetracyclo[4.4.0.1$^{2,5}$.1$^{7,10}$]dodecanyl)-1,1-difluoroethanesulfonate, 4-t-butylphenyldiphenylsulfonium N,N-bis(nonafluoro-n-butanesulfonyl)imidate, tri(4-t-butylphenyl)sulfonium trifluoromethanesulfonate, tri(4-t-butylphenyl)sulfonium nonafluoro-n-butanesulfonate, tri(4-t-butylphenyl)sulfonium perfluoro-n-octanesulfonate, tri(4-t-butylphenyl)sulfonium 2-bicyclo[2.2.1]hept-2-yl-1,1,2,2-tetrafluoroethanesulfonate, tri(4-t-butylphenyl)sulfonium 2-(3-tetracyclo[4.4.0.1$^{2,5}$.1$^{7,10}$]dodecanyl)-1,1-difluoroethanesulfonate, tri(4-t-butylphenyl)sulfonium N,N-bis(nonafluoro-n-butanesulfonyl)imidate, tri(4-t-butylphenyl)sulfonium camphorsulfonate,
diphenyliodonium trifluoromethanesulfonate, diphenyliodonium nonafluoro-n-butanesulfonate, diphenyliodonium perfluoro-n-octanesulfonate, diphenyliodonium 2-bicyclo[2.2.1]hept-2-yl-1,1,2,2-tetrafluoroethanesulfonate, diphenyliodonium 2-(3-tetracyclo)[4.4.0.1$^{2,5}$.1$^{7,10}$]dodecanyl)-1,1-difluoroethanesulfonate, diphenyliodonium N,N-bis(nonafluoro-n-butanesulfonyl)imidate, diphenyliodonium camphorsulfonate, bis(4-t-butylphenyl)iodonium trifluoromethanesulfonate, bis(4-t-butylphenyl)iodonium nonafluoro-n-butanesulfonate, bis(4-t-butylphenyl)iodonium perfluoro-n-octanesulfonate, bis(4-t-butylphenyl)iodonium 2-bicyclo[2.2.1]hept-2-yl-1,1,2,2-tetrafluoroethanesulfonate, bis(4-t-butylphenyl)iodonium 2-(3-tetracyclo)[4.4.0.1$^{2,5}$.1$^{7,10}$]dodecanyl)-1,1-difluoroethanesulfonate, bis(4-t-butylphenyl)iodonium N,N-bis(nonafluoro-n-butanesulfonyl)imidate, bis(4-t-butylphenyl)iodonium camphorsulfonate,
1-(4-n-butoxynaphthalene-1-yl)tetrahydrothiophenium trifluoromethanesulfonate, 1-(4-n-butoxynaphthalene-1-yl)tetrahydrothiophenium nonafluoro-n-butanesulfonate, 1-(4-n-butoxynaphthalene-1-yl)tetrahydrothiophenium perfluoro-n-octanesulfonate, 1-(4-n-butoxynaphthalene-1-yl)tetrahydrothiophenium 2-bicyclo[2.2.1]hept-2-yl-1,1,2,2-tetrafluoroethanesulfonate, 1-(4-n-butoxynaphthalene-1-yl)tetrahydrothiophenium 2-(3-tetracyclo[4.4.0.1$^{2,5}$.1$^{7,10}$]dodecanyl)-1,1-difluoroethanesulfonate, 1-(4-n-butoxynaphthalene-1-yl)tetrahydrothiophenium N,N-bis(nonafluoro-n-butanesulfonyl)imidate, 1-(4-n-butoxynaphthalene-1-yl)tetrahydrothiophenium camphorsulfonate,
1-(3,5-dimethyl-4-hydroxyphenyl)tetrahydrothiophenium trifluoromethanesulfonate, 1-(3,5-dimethyl-4-hydroxyphenyl)tetrahydrothiophenium nonafluoro-n-butanesulfonate, 1-(3,5-dimethyl-4-hydroxyphenyl)tetrahydrothiophenium perfluoro-n-octanesulfonate, 1-(3,5-dimethyl-4-hydroxyphenyl)tetrahydrothiophenium 2-bicyclo[2.2.1]hept-2-yl-1,1,2,2-tetrafluoroethanesulfonate, 1-(3,5-dimethyl-4-hydroxyphenyl)tetrahydrothiophenium 2-(3-tetracyclo[4.4.0.1$^{2,5}$.1$^{7,10}$]dodecanyl)-1,1-difluoroethanesulfonate, 1-(3,5-dimethyl-4-hydroxyphenyl)tetrahydrothiophenium N,N-bis(nonafluoro-n-butanesulfonyl)imidate, 1-(3,5-dimethyl-4-hydroxyphenyl)tetrahydrothiophenium camphorsulfonate,
N-(trifluoromethanesulfonyloxy)succinimide, N-(nonafluoro-n-butanesulfonyloxy)succinimide, N-(perfluoro-n-octanesulfonyloxy)succinimide, N-(2-bicyclo[2.2.1]hept-2-yl-1,1,2,2-tetrafluoroethanesulfonyloxy)succinimide, N-(2-(3-tetracyclo[4.4.0.1$^{2,5}$.1$^{7,10}$]dodecanyl)-1,1-difluoroethanesulfonyloxy)succinimide, N-(camphorsulfonyloxy)succinimide,
N-(trifluoromethanesulfonyloxy)bicyclo[2.2.1]hept-5-ene-2,3-dicarboxyimide, N-(nonafluoro-n-butanesulfonyloxy)bicyclo[2.2.1]hept-5-ene-2,3-dicarboxyimide, N-(perfluoro-n-octanesulfonyloxy)bicyclo[2.2.1]hept-5-ene-2,3-dicarboxyimide, N-(2-bicyclo[2.2.1]hept-2-yl-1,1,2,2-tetrafluoroethanesulfonyloxy)bicyclo[2.2.1]hept-5-ene-2,3-dicarboxyimide, N-(2-(3-tetracyclo[4.4.0.1$^{2,5}$.1$^{7,10}$]dodecanyl)-1,1-difluoroethanesulfonyloxy)bicyclo[2.2.1]hept-5-ene-2,3-dicarboxyimide, N-(camphorsulfonyloxy)bicyclo[2.2.1]hept-5-ene-2,3-dicarboxyimide and the like.

The above-mentioned acid generator (B) may be used singly or in combination of two or more types thereof.

The content of this acid generator (B) is preferably in the range from 0.1 to 15 parts by weight, more preferably from 0.1 to 10 parts by weight, and further preferably 0.1 to 5 parts by weight based on 100 parts by weight of the polymer (A). When the content is in this range from 0.1 to 15 parts by weight, blob defects can be reduced and further a good resist pattern can be obtained. If the content of the acid generator (B) is less than 0.1 part by weight, the effect of reducing blob defects may be insufficient. On the other hand, if the content is more than 15 parts by weight, a top loss of a resist pattern after development is remarkably increased, so that the resultant resist pattern may not easily be rectangular.

In the composition for formation of an upper antireflective film (II) of the present invention, the above-mentioned "compound (C)" is a compound having a sulfonic acid residue. This compound (C) is not particularly limited and is preferably a compound represented by the following general formula (I).

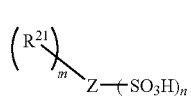

(I)

[In the formula (I), $R^{21}$ represents a linear or branched alkyl group having carbon atoms of 1 to 10, an alicyclic alkyl group having carbon atoms of 3 to 20 or a derivative thereof, a hydroxyl group, a carboxyl group, an alkylether group, an alkyloxycarbonyl group or an alkylcarbonyloxy group, Z represents a linear, branched or alicyclic hydrocarbon group, having carbon atoms of 4 to 12, or an aromatic hydrocarbon group which may have a substituent, m is an integer of 0 to 4, and n is an integer of 1 to 4. When plural $R^{21}$s are present, $R^{21}$s may be the same or different from each other.]

Examples of the linear and branched alkyl group having carbon atoms of 1 to 10 as $R^{21}$ in the above-mentioned formula (I) include methyl group, ethyl group, n-propyl group, i-propyl group, n-butyl group, 2-methylpropyl group, 1-methylpropyl group, t-butyl group, n-pentyl group, neopentyl group, n-hexyl group, n-heptyl group, n-octyl group, 2-ethylhexyl group, n-nonyl group, n-decyl group and the like.

Additionally, examples of the alicyclic alkyl group or the derivative thereof as $R^{21}$ in the above-mentioned formula (I) include a group derived from an alicyclic ring consisting of a cycloalkane such as norbornane, tricyclodecane, tetracyclododecane, adamantane, cyclobutane, cyclopentane, cyclohexane, cycloheptane and cyclooctane; a group in which the group derived from the alicyclic ring is substituted with one or more types, or, one or more groups of a linear, branched or cyclic alkyl group such as methyl group, ethyl group, n-propyl group, i-propyl group, n-butyl group, 2-methylpropyl group, 1-methylpropyl group and t-butyl group, or with one or more groups of a hydroxyl group, a hydroxyalkyl group, a cyano group, a cyanoalkyl group or the like; and the like.

Examples of the linear, branched or alicyclic hydrocarbon group having carbon atoms of 4 to 12 as Z in the above-mentioned formula (I) include a saturated chain hydrocarbon group such as 1-methyl-1,3-propylene group, 2-methyl-1,3-propylene group, 1,4-butylene group, 1-methyl-1,4-butylene group, 2-methyl-1,4-butylene group, 1,5-pentylene group, 1,1-dimethyl-1,4-butylene group, 1,6-hexylene group; a monocyclic hydrocarbon ring group including a cyclobutylene group such as 1,3-cyclobutylene, a cyclopentylene group such as 1,3-cyclopentylene, a cyclohexylene group such as 1,4-cyclohexylene group, a cyclooctylene group such as 1,5-cyclooctylene group, and the like; a bridged-cyclic hydrocarbon ring group including a norbornylene group such as 1,4-norbornylene group and 2,5-norbornylene group, an adamantylene group such as 1,5-adamantylene group and 2,6-adamantylene group, and the like.

Furthermore, examples of the aromatic hydrocarbon group which may have a substituent as Z in the above-mentioned formula (I) include a phenyl group, a naphthyl group, a thiophenyl group and the like.

Specific examples of the above-mentioned compound (C) include a fluoroalkylsulfonic acid such as trifluoromethanesulfonic acid, pentafluoroethanesulfonic acid, heptafluoropropanesulfonic acid, nonafluorobutanesulfonic acid, dodecafluoropentanesulfonic acid, tridecafluorohexanesulfonic acid, pentadecafluoroheptanesulfonic acid, heptadecafluorooctanesulfonic acid, octadecafluorononanesulfonic acid, fluoromethanesulfonic acid, difluoromethanesulfonic acid, 1,1-difluoroethanesulfonic acid, 2,2,2-trifluoroethanesulfonic acid, 1,1-difluoropropanesulfonic acid, 1,1,2,2-tetrafluoropropanesulfonic acid, 3,3,3-trifluoropropanesulfonic acid, 2,2,3,3,4,4,4-heptafluorobutanesulfonic acid and 3,3,4,4,4-pentafluorobutanesulfonic acid;

an alkylsulfonic acid such as methanesulfonic acid, ethanesulfonic acid, propanesulfonic acid, isopropanesulfonic acid, butanesulfonic acid, isobutanesulfonic acid, 1,1-dimethylethanesulfonic acid, pentanesulfonic acid, 1-methylbutanesulfonic acid, 2-methylbutanesulfonic acid, 3-methylbutanesulfonic acid, neopentanesulfonic acid, hexanesulfonic acid, heptanesulfonic acid, octanesulfonic acid, nonanesulfonic acid, and decanesulfonic acid; an arylsulfonic acid such as benzenesulfonic acid, 2-toluenesulfonic acid, 3-toluenesulfonic acid, 4-toluenesulfonic acid, 4-ethylbenzenesulfonic acid, 4-propylbenzenesulfonic acid, 4-butylbenzenesulfonic acid, 4-(t-butyl)benzenesulfonic acid, 2,5-dimethylbenzenesulfonic acid, 2-mesithylenesulfonic acid, 2,4-dinitrobenzenesulfonic acid, 4-chlorobenzenesulfonic acid, 4-bromobenzenesulfonic acid, 4-fluorobenzenesulfonic acid, 2,3,4,5,6-pentafluorobenzenesulfonic acid, 4-hydroxybenzenesulfonic acid, 2-hydroxybenzenesulfonic acid, 3-hydroxybenzenesulfonic acid, 3-sulfosalicylic acid, 4-sulfosalicylic acid, 5-sulfosalicylic acid, 1-naphthylsulfonic acid, 2-naphthylsulfonic acid, cyclohexylsulfonic acid, 2-hydroxycyclohexylsulfonic acid, 3-hydroxycyclohexylsulfonic acid, 4-sulfobenzoic acid, and 4-sulfoaniline;

an aralkylsulfonic acid such as benzylsulfonic acid and phenethylsulfonic acid; a cyclic sulfonic acid such as camphorsulfonic acid; benzenesulfonic acid, 2-hydroxybenzenesulfonic acid, 3-hydroxybenzenesulfonic acid, 3-sulfosalicylic acid, 4-sulfosalicylic acid, 5-sulfosalicylic acid, 1-naphthylsulfonic acid, 2-naphthylsulfonic acid, cyclohexylsulfonic acid, 2-hydroxycyclohexylsulfonic acid, 3-hydroxycyclohexylsulfonic acid, poly(4-styrenesulfonic acid), polyvinylnaphthalene sulfonic acid and the like.

The above-mentioned compound (C) may be used singly or in combination of two or more types thereof.

Additionally, the content of the above-mentioned compound (C) is preferably in the range from 0.1 to 15 parts by weight, more preferably from 0.1 to 10 parts by weight and further preferably from 0.1 to 5 parts by weight based on 100 parts by weight of the polymer (A). When the content is in the range from 0.1 to 15 parts by weight, blob defect can be reduced and further a good resist pattern shape can be obtained. If this content is less than 0.1 part by weight, the effect of reducing the blob defect may become insufficient. On the other hand, if the content is more than 15 parts by weight, a top loss of a pattern of the resist is remarkably increased after the resist is developed, so that the resultant resist pattern may not easily become a rectangular resist pattern.

Additionally, a surfactant may be further incorporated into the composition for formation of an upper antireflective film (II) of the present invention for the purpose of improving the coatability, defoamability, leveling performance and the like.

As the above-mentioned surfactant, a fluorine-based surfactant including commercial products such as "BM-1000" and "BM-1100" manufactured by BM-Chemie, "Megafak F142D", "Megafak F172", "Megafak F173" and "Megafak F183" manufactured by Dainippon ink and chemicals Inc., "Fluorad FC-135", "Fluorad FC-170C", "Fluorad FC-430" and "Fluorad FC-431" manufactured by Sumitomo 3M Ltd., "Surfron S-112", "Surfron S-113", "Surfron S-131" and "Surfron S-141" manufactured by Asahi glass Co., Ltd., "SH-28PA", "SH-190", "SH-193", "SZ-6032" and "SF8428" manufactured by Dow Corning Toray Co., Ltd., and "EMULGEN A-60", "EMULGEN 104P" and "EMULGEN 306P" manufactured by Kao Corp. The surfactant may be used singly or in combination of two or more types thereof.

The formulating amount of the above-mentioned surfactant is preferably 5 parts or less by weight based on 100 parts by weight of the above-mentioned polymer (A).

In addition, the composition (II) for formation of an upper antireflective film of the present invention is preferably a composition prepared by dissolving the components into a solvent so as to give, for example, a concentration in the range usually from 0.1% to 15% by weight and preferably from 0.1% to 10% by weight, and then filtrating with a filter having a pore diameter of, for example, about 20 nm.

The above-mentioned solvent may be used one in which lithographic performance hardly deteriorates, for example in the case where the solvent undergoes an intermixing with a photoresist film at coating of the composition for formation of an upper antireflective film (II) on the photoresist film.

Examples of the solvent include a monovalent alcohol, a polyvalent alcohol, an alkylether of a polyvalent alcohol, an alkyletheracetate of a polyvalent alcohol, an ether, a cyclic ether, a higher hydrocarbon, an aromatic hydrocarbon, a ketone, an ester, water and the like.

The above-mentioned monovalent alcohol is preferably a monovalent alcohol having carbon atoms of 4 to 8. Specific example thereof includes 2-methyl-1-propanol, 1-butanol, 2-butanol, 1-pentanol, 2-pentanol, 3-pentanol, 3-methyl-2-pentanol, 4-methyl-2-pentanol, 2-ethyl-1-butanol, 2,4-dimethyl-3-pentanol and the like.

Examples of the above-mentioned polyvalent alcohol include ethylene glycol, propylene glycol and the like.

Examples of the above-mentioned alkylether of a polyvalent alcohol include ethylene glycol monomethylether, ethylene glycol monoethylether, ethylene glycol dimethylether, ethylene glycol diethylether, diethylene glycol monomethylether, diethylene glycol monoethylether, diethylene glycol dimethylether, diethylene glycol diethylether, diethylene glycol ethylmethylether, propylene glycol monomethylether, propylene glycol monoethylether and the like.

Examples of the above-mentioned alkyletheracetate include ethylene glycol ethyletheracetate, diethylene glycol ethyletheracetate, propylene glycol ethyletheracetate, propylene glycol monomethyletheracetate and the like.

Examples of the above-mentioned ether include dipropylether, diisopropylether, butylmethylether, butylethylether, butylpropylether, dibutylether, diisobutylether, tert-butylmethylether, tert-butyl-ethylether, tert-butyl-propylether, di-tert-butylether, dipentylether, diisoamylether, cyclopentylmethylether, cyclohexylmethylether, cyclopentylethylether, cyclohexylethylether, cyclopentylpropylether, cyclopentyl-2-propylether, cyclohexylpropylether, cyclohexyl-2-propylether, cyclopentylbutylether, cyclopentyl-tert-butylether, cyclohexylbutylether, cyclohexyl-tert-butylether and the like.

Examples of the above-mentioned cyclic ether include tetrahydrofuran, dioxane and the like.

Examples of the above-mentioned higher hydrocarbon include decane, dodecane, undecane and the like.

Examples of the above-mentioned aromatic hydrocarbon include benzene, toluene, xylene and the like.

Examples of the above-mentioned ketone include acetone, methyl ethyl ketone, methyl isobutyl ketone, cyclohexanone, 4-hydroxy-4-methyl-2-pentanone, diacetone alcohol and the like.

Examples of the above-mentioned ester include ethyl acetate, butyl acetate, ethyl 2-hydroxypropionate, methyl 2-hydroxy-2-methylpropionate, ethyl 2-hydroxy-2-methylpropionate, ethyl ethoxyacetate, ethyl hydroxyacetate, methyl 2-hydroxy-3-methylbutyrate, methyl 3-methoxypropionate, ethyl 3-methyoxypropionate, ethyl 3-ethyoxypropionate, methyl 3-ethyoxypropionate and the like.

Among these, a monovalent alcohol, an ether, a cyclic ether, an alkylether of a polyvalent alcohol, an alkyletheracetate of a polyvalent alcohol and a higher hydrocarbon are preferred.

The solvent may be used singly or in combination of two or more types thereof.

Additionally, the refractive index (n value) at a wavelength of 193 nm for a film obtained using the present composition (II) for formation of an upper antireflective film is preferably 1.5 or less, more preferably in the range from 1.25 to 1.45, and further preferably from 1.25 to 1.4. When the refractive index is 1.5 or less, the reflection of light in a laminate to be yielded is restrained so that the standing wave effect can be reduced, being favorable.

The refractive index can be measured with an ellipsometer after coating the composition (II) for formation of an upper antireflective film onto a silicon wafer having a diameter of 8 inches.

[5] Formation Method of Resist Pattern (II)

The formation method of a resist pattern (II) of the present invention is characterized by comprising:

(1) a process for forming a photoresist film on a substrate (hereinafter referred to as "process (1)");

(2) a process for forming an upper antireflective film on the photoresist film, using the composition (II) for forming an upper antireflective film (hereinafter referred to as "process (2)");

(3) a process for irradiating a predetermined region of the photoresist film on which the upper antireflective film is formed with a radiation, thereby performing exposure (hereinafter referred to as "process (3)"); and (4) a process for developing the resultant to remove the upper antireflective film (hereinafter referred to as "process (4)").

In the above-mentioned process (1), a photoresist film is formed on a substrate.

Specifically, a resist composition solution is coated over a substrate in an appropriate coating manner such as spin coating, cast coating and roll coating so as to obtain a photoresist film having a predetermined thickness, and then the resultant is subjected to preliminary firing (hereinafter referred to as "pre-baking (PB)") and volatilizing the solvent in the coating film, sequentially. In this way, the photoresist film is formed.

The above-mentioned substrate may be a silicon wafer, a wafer coated with aluminum, and the like. In order to bring out the potential of the resultant photoresist film to the maximum extent, an organic or inorganic antireflection film may be formed in advance on the substrate using a method described in, for example, JP-B H6-12452 or the like.

The above-mentioned resist composition solution is not particularly limited, and may be appropriately selected in accordance with the intended use of the photoresist. A specific example of the resist composition solution is a resist composition solution prepared by dissolving a chemically amplification type resist composition or the like which contains an acid generator or the like in an appropriate solvent so as to give, for example, a solid concentration in the range from 0.1% to 20% by weight and then filtrating with a filter having a pore diameter of, for example, about 30 nm. A commercially available resist solution may be used as it is.

Additionally, the resist composition solution may be of a positive type or of a negative type, and is preferably a positive type resist composition solution. In a chemically amplification positive type resist, an acid generated from the acid generator by exposure leads to a dissociation of an acid-dissociating organic group in the polymer, for example, a carboxyl group is generated. As a result, the solubility of the exposed region of the resist to an alkaline developer becomes high so that the exposed region is dissolved and removed by the alkaline developer. Thus, a positive type resist pattern is obtained.

In the above-mentioned process (2), the composition for formation of an upper antireflective film (I) is used to form an upper antireflective film on the above-mentioned photoresist film. The composition for formation of an upper antireflective film (II) can have the explanation on the composition described above as it is.

Specifically, the composition for formation of an upper antireflective film (I) is coated over the photoresist film in an appropriate coating manner such as spin coating, cast coating and roll coating so as to obtain an upper antireflective film having a predetermined thickness, and then the resultant is subjected to preliminary firing and volatilizing the solvent, sequentially. In this way, the upper antireflective film is formed.

Regarding the thickness of the above-mentioned upper antireflective film, closer is the thickness to an odd multiple of $\lambda/4$ m wherein $\lambda$ represents the wavelength of a radiation, and m represents the refractive index of the upper antireflective film, larger effect in reflection-restraining at an upper surface of the photoresist film can be obtained. It is therefore preferred to make the thickness of the upper antireflective film closer to this value.

In the invention, any one of the pre-baking after the resist composition solution is coated in the above-mentioned process (1) and the firing after coating of the composition for formation of an upper antireflective film in the above-mentioned process (2) may be omitted in order to make the process simple.

In the above-mentioned process (3), a radiation is emitted to a predetermined region of the photoresist film on which the upper antireflective film is formed, thereby performing exposure.

The radiation is appropriately selected in accordance with the components which constitute the photoresist film, and a combination of the photoresist film with the upper antireflective film. Examples of the radiation include visible rays; ultraviolet rays such as g-lines and i-lines; far ultraviolet rays such as an excimer laser; X-rays such as a synchrotron radiation; charged particle beams such as an electron beam; and various other radiations. Of these rays, an ArF excimer laser (wavelength; 193 nm) and a KrF excimer laser (wavelength; 248 nm) are preferable and preferred is an ArF excimer laser.

Additionally, In order to improve the resolution, pattern shape, developability and the like of the photoresist film, it is preferred that firing (hereinafter, referred to as "PEB") is performed after the exposure. The firing temperature therefor is appropriately adjusted in accordance with the used resist composition, and others. The temperature is usually in the range from about 30° C. to 200° C., and preferably from 50° C. to 150° C.

In the above-mentioned process (4), the photoresist film and the upper antireflective film are simultaneously removed by development.

Specifically, the photoresist film is developed with a developer, and then washed. Thereafter, a desired resist pattern is formed, and further the above-mentioned upper antireflective film is completely removed, without being subjected to any separate peeling process, during the development or during the washing after the development.

Examples of the above-mentioned developer include an alkaline aqueous solution prepared by dissolving sodium hydroxide, potassium hydroxide, sodium carbonate, sodium silicate, sodium metasilicate, ammonia, ethylamine, n-propylamine, diethylamine, di-n-propylamine, triethylamine, methyldiethylamine, dimethylethanolamine, triethanolamine, tetramethylammonium hydroxide, tetraethylammonium hydroxide, pyrrole, piperidine, choline, 1,8-diazabicyclo-[5.4.0]-7-undecene, 1,5-diazabicyclo-[4.3.0]-5-nonane and the like.

Additionally, appropriate amounts of an aqueous organic solvent such as an alcohol including methanol, ethanol and the like, a surfactant and the like may be added to the developer.

After development using the alkaline aqueous solution, washing with water and drying are generally carried out.

EXAMPLES

Hereinafter, the present invention will be described in greater detail by referring to the following Examples. The present invention is in no way limited by these Examples.

1. Examples 1 to 8 and Comparative Examples 1 to 2

[1-1] Synthesis of Resin for Formation of Upper Antireflective Film

Hereinafter, synthesis examples for polymers including polymers (A-1) to (A-8) and polymers (a-1) to (a-2) will be described. Physical evaluation of the polymers obtained by synthesis examples were conducted according to the methods as follows.
(1) Mw These were measured by gel permeation chromatography (GPC) with monodispersed polystyrene as a standard reference material using GPC column ("G2000HXL"×2, "G3000HXL"×1, "G4000HXL"×1) manufactured by Tosoh Corp. under the following analysis conditions: flow rate; 1.0 ml/min., eluate; tetrahydrofuran, column temperature; 40° C.
(2) Copolymerization Ratio The copolymerization ratio between the individual monomers was determined according to the area ratio between peaks originating from side chain groups of the monomers in absorption spectra of $^1$H-NMR and $^{13}$C-NMR

Synthesis Example 1

Into a separable flask equipped with a stirrer, a thermostat and a condenser was charged with 30 g of tetrahydrofuran (THF). The system was subjected to bubbling with a nitrogen gas for 15 minutes and then 2.2888 g of 6-vinyl-2-naphthol, 8.2945 g of 1-vinylnaphthalene, 9.4167 g of α-trifluoromethyl acrylic acid and 1.8577 g of 2,2'-azobis(dimethyl 2-methylpropionate) were added. The internal temperature was raised to a temperature of 45° C. After one hour, the internal temperature was raised, so that the reactive components were caused to react with each other for 8 hours while the solution was refluxed at a temperature of about 70° C. The system was then cooled to a temperature of 25° C. Next, the resultant was vacuum-dried to remove the solvent, thereby yielding a copolymer.

This copolymer had an Mw of $2.7 \times 10^3$, and a copolymerization ratio (% by mole) of 6-vinyl-2-naphthol/1-vinylnaphthalene/α-trifluoromethyl acrylic acid was 10/40/50. This copolymer was taken as "polymer (A-1)".

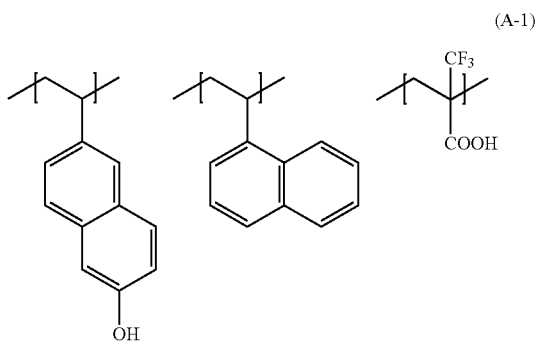

(A-1)

Synthesis Example 2

Into a separable flask equipped with a stirrer, a thermostat and a condenser was charged with 30 g of methanol. The system was subjected to bubbling with a nitrogen gas for 15 minutes and then 1.4913 g of 6-vinyl-2-naphthol, 9.4576 g of 2-vinylnaphthalene, 9.0500 g of methacrylic acid and 2.4209 g of 2,2'-azobis(dimethyl 2-methylpropionate) were added. The internal temperature was raised to a temperature of 45° C. After one hour, the internal temperature was raised, so that the reactive components were caused to react with each other for 8 hours while the solution was refluxed at a temperature of about 70° C. The system was then cooled to a temperature of 25° C. Next, the resultant was vacuum-dried to remove the solvent, thereby yielding a copolymer.

This copolymer had an Mw of $19.5 \times 10^3$, and a copolymerization ratio (% by mole) of 6-vinyl-2-naphthol/2-vinylnaphthalene/methacrylic acid was 5/35/60. This copolymer was taken as "polymer (A-2)".

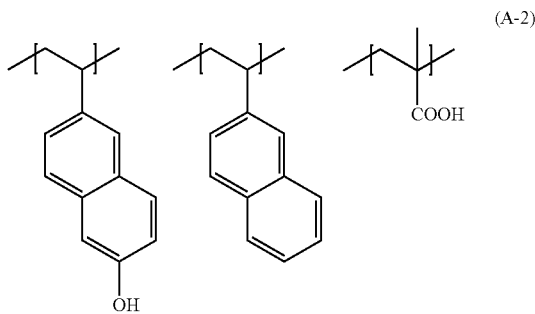

(A-2)

Synthesis Example 3

Into a separable flask equipped with a stirrer, a thermostat and a condenser was charged with 30 g of methyl isobutyl ketone (hereinafter referred to as "MIBK"). The system was subjected to bubbling with a nitrogen gas for 15 minutes and then 8.1297 g of 2-vinylnaphthalene, 4.4866 g of 6-vinyl-2-naphthol, 7.3837 g of α-trifluoromethyl acrylic acid and 4.5521 g of 2,2'-azobis(dimethyl 2-methylpropionate) were added. The internal temperature was raised to a temperature of 45° C. After one hour, the internal temperature was raised, so that the reactive components were caused to react with each other at a temperature of 90° C. for 8 hours. The system was then cooled to a temperature of 25° C. Next, the resultant was vacuum-dried to remove the solvent, thereby yielding a copolymer.

This copolymer had an Mw of $3.1 \times 10^3$, and a copolymerization ratio (% by mole) of 2-vinylnaphthalene/6-vinyl-2-naphthol/α-trifluoromethyl acrylic acid was 40/20/40. This copolymer was taken as "polymer (A-3)".

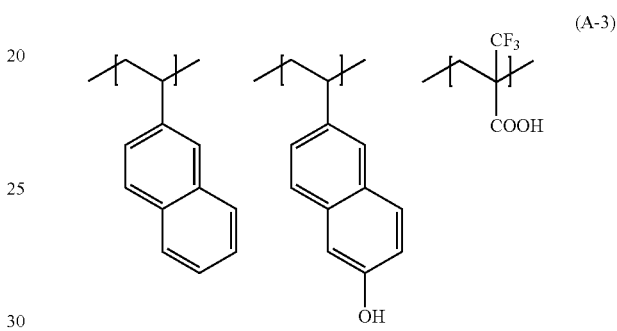

(A-3)

Synthesis Example 4

Into a separable flask equipped with a stirrer, a thermostat and a condenser was charged with 30 g of MIBK. The system was subjected to bubbling with a nitrogen gas for 15 minutes and then 8.9514 g of 6-vinyl-2-naphthol, 11.0486 g of α-trifluoromethyl acrylic acid and 4.541 g of 2,2'-azobis(dimethyl 2-methylpropionate) were added. The internal temperature was raised to a temperature of 45° C. After one hour, the internal temperature was raised, so that the reactive components were caused to react with each other at a temperature of 90° C. for 8 hours. The system was then cooled to a temperature of 25° C. Next, the resultant was vacuum-dried to remove the solvent, thereby yielding a copolymer.

This copolymer had an Mw of $2.6 \times 10^3$, and a copolymerization ratio (% by mole) of 6-vinyl-2-naphthol/α-trifluoromethyl acrylic acid was 40/60. This copolymer was taken as "polymer (A-4)".

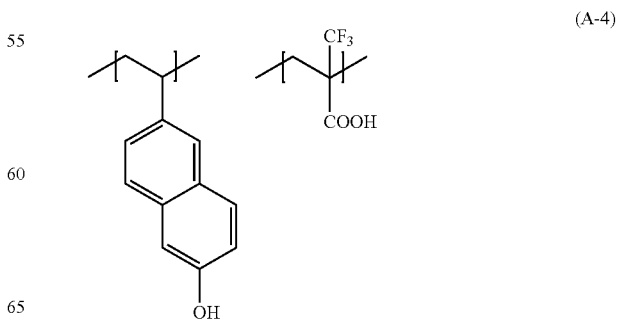

(A-4)

Synthesis Example 5

Into a separable flask equipped with a stirrer, a thermostat and a condenser was charged with 50 g of methyl ethyl ketone. The system was subjected to bubbling with a nitrogen gas was for 15 minutes and then 4.7373 g of 6-vinyl-2-naphthol, 3.8981 g of α-trifluoromethyl acrylic acid, 1.3300 g of maleic anhydride and 1.3646 g of 2,2'-azobis(dimethyl 2-methylpropionate) were added. The internal temperature was raised to a temperature of 45° C. After one hour, the internal temperature was raised, so that the reactive components were caused to react with each other at a temperature of 70° C. for 8 hours. The system was then cooled to a temperature of 25° C. Next, 3 g of a 1% aqueous solution of oxalic acid was added thereto in a slow dropwise manner. The internal temperature was then raised to a temperature of 70° C. to cause the reactive components to react with each other for 2 hours. Thereafter, the reaction solution was washed with 50 g of water 3 times, and then vacuum-dried to remove the solvent, thereby yielding a copolymer.

This copolymer had an Mw of $3.5 \times 10^3$, and a copolymerization ratio (% by mole) of 6-vinyl-2-naphthol/α-trifluoromethyl acrylic acid/maleic acid was 40/40/20. This copolymer was taken as "polymer (A-5)".

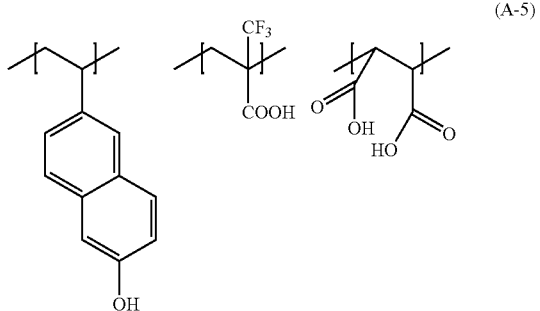

(A-5)

Synthesis Example 6

Into a separable flask equipped with a stirrer, a thermostat and a condenser was charged with 30 g of MIBK. The system was subjected to bubbling with a nitrogen gas for 15 minutes and then 7.8742 g of 6-vinyl-2-naphthol, 8.0992 g of α-trifluoromethyl acrylic acid, 4.0266 g of 4,4,5,5,6,6,7,7,7-nonafluoro-2-hydroxyheptyl acrylate and 3.9946 g of 2,2'-azobis (dimethyl 2-methylpropionate) were added. The internal temperature was raised to a temperature of 45° C. After one hour, the internal temperature was raised, so that the reactive components were caused to react with each other at a temperature of 90° C. for 8 hours. The system was then cooled to a temperature of 25° C. Next, the resultant was vacuum-dried to remove the solvent, thereby yielding a copolymer.

This copolymer had an Mw of $3.3 \times 10^3$, and a copolymerization ratio (% by mole) of 6-vinyl-2-naphthol/α-trifluoromethyl acrylic acid/4,4,5,5,6,6,7,7,7-nonafluoro-2-hydroxyheptyl acrylate was 40/50/10. This copolymer was taken as "polymer (A-6)".

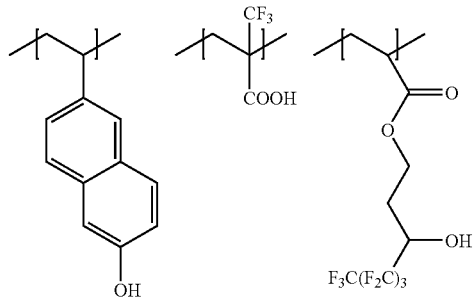

(A-6)

Synthesis Example 7

Into a separable flask equipped with a stirrer, a thermostat and a condenser was charged with 30 g of MIBK. The system was subjected to bubbling with a nitrogen gas for 15 minutes and then 2.6936 g of 2-vinylnaphthalene, 4.4597 g of 6-vinyl-2-naphthol, 8.0992 g of α-trifluoromethyl acrylic acid, 12.8467 g of 4,4,4-trifluoro-3-hydroxy-1-methyl-3-trifluoromethylbutyl methacrylate and 3.0165 g of 2,2'-azobis(dimethyl 2-methylpropionate) were added. The internal temperature was raised to a temperature of 45° C. After one hour, the internal temperature was raised, so that the reactive components were caused to react with each other at a temperature of 90° C. for 8 hours. The system was then cooled to a temperature of 25° C. Next, the resultant was vacuum-dried to remove the solvent, thereby yielding a copolymer.

This copolymer had an Mw of $2.9 \times 10^3$, and a copolymerization ratio (% by mole) of 2-vinylnaphthalene/6-vinyl-2-naphthol/4,4,4-trifluoro-3-hydroxy-1-methyl-3-trifluoromethylbutyl methacrylate was 20/30/50. This copolymer was taken as "polymer (A-7)".

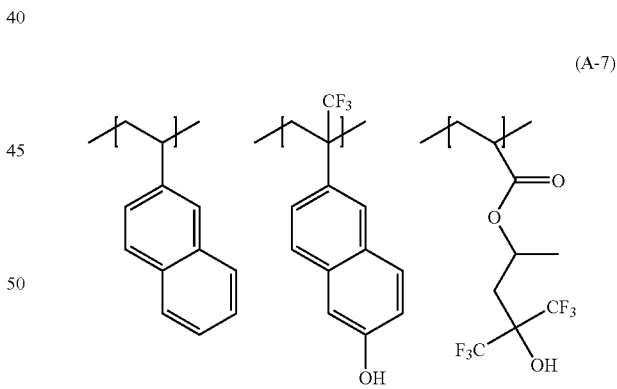

(A-7)

Synthesis Example 8

Into a separable flask equipped with a stirrer, a thermostat and a condenser was charged with 30 g of MIBK. The system was subjected to bubbling with a nitrogen gas for 15 minutes and 10.6017 g of 6-vinyl-2-naphthol, 6.9790 g of α-trifluoromethyl acrylic acid, 2.4193 g of sulfoethyl methacrylate and 4.3026 g of 2,2'-azobis(dimethyl 2-methylpropionate) were added. The internal temperature was raised to a temperature of 45° C. After one hour, the internal temperature was raised, so that the reactive components were caused to react with each other at a temperature of 90° C. for 8 hours. The system was then cooled to a temperature of 25° C. Next, the resultant was vacuum-dried to remove the solvent, thereby yielding a copolymer.

This copolymer had an Mw of $3.1\times10^3$, and a copolymerization ratio (% by mole) of 6-vinyl-2-naphthol/α-trifluoromethyl acrylic acid/sulfoethyl methacrylate was 50/40/10. This copolymer was taken as "polymer (A-8)".

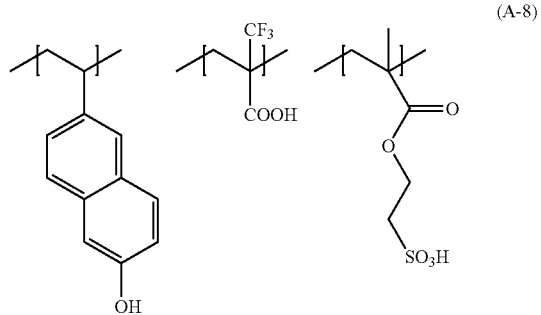

(A-8)

Synthesis Example 9

Into a separable flask equipped with a stirrer, a thermostat and a condenser were charged with 60 g of methanol and 10 g of isopropyl alcohol. The system was subjected to bubbling with a nitrogen gas for 15 minutes and 17.4092 g of 3-(perfluoro-n-butyl)-2-hydroxypropyl acrylate, 2.5908 g of 2-acrylamide-2-methylpropanesulfonic acid and 2.1588 g of 2,2'-azobis[N-(2-carboxyethyl)-2-methylpropionamide]hydrate were added. The internal temperature was raised to a temperature of 45° C. After one hour, the internal temperature was raised to a temperature of 60° C., so that the reactive components were caused to react further with each other for 8 hours. The system was then cooled to a temperature of 25° C. Next, the resultant was vacuum-dried to remove the solvent, thereby yielding a copolymer.

This copolymer had an Mw of $4.5\times10^3$, and a copolymerization ratio (% by mole) of 2-acrylamide-2-methylpropanesulfonic acid/3-(perfluoro-n-butyl)-2-hydroxypropyl acrylate was 20/80. This copolymer was taken as "polymer (a-1)".

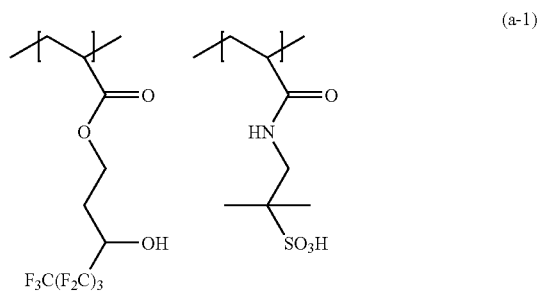

(a-1)

Synthesis Example 10

Into a separable flask equipped with a stirrer, a thermostat and a condenser were charged with 60 g of methanol and 10 g of isopropyl alcohol. The system was subjected to bubbling with a nitrogen gas for 15 minutes and 18.5591 g of 3-(perfluoro-n-hexyl)-2-hydroxypropyl acrylate, 1.4409 g of vinylsulfonic acid and 2.3014 g of 2,2'-azobis[N-(2-carboxyethyl)-2-methylpropionamide]hydrate were added. The internal temperature was raised to a temperature of 45° C. After one hour, the internal temperature was raised to a temperature of 60° C., so that the reactive components were caused to react further with each other for 8 hours. The system was then cooled to a temperature of 25° C. Next, the resultant was vacuum-dried to remove the solvent, thereby yielding a copolymer.

This copolymer had an Mw of $3.9\times10^3$, and a copolymerization ratio (% by mole) of vinylsulfonic acid/3-(perfluoro-n-hexyl)-2-hydroxypropyl acrylate was 20/80. This copolymer was taken as "polymer (a-2)".

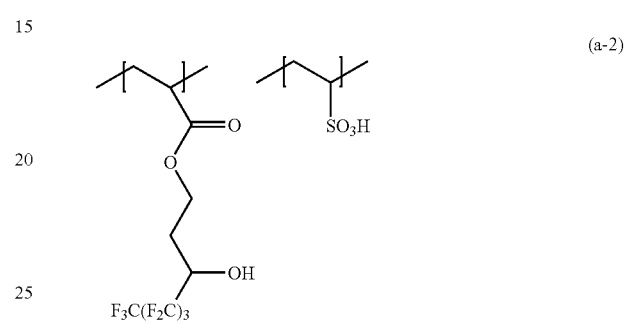

(a-2)

[1-2] Preparation of Composition for Formation of Upper Antireflective Film (I)

Examples 1 to 8

4-methyl-2-pentanol was added to 100 parts by weight of the polymer shown in Table 1 to set the solid concentration to 1% by weight, and then the resultant was filtrated through a membrane filter having a pore diameter of 0.2 μm to yield a composition for formation of an upper antireflective film for Examples 1 to 8.

Comparative Examples 1 to 2

1-butanol was added to 100 parts by weight of the polymer shown in Table 1 to set the solid concentration to 1% by weight, and then the resultant was filtrated through a membrane filter having a pore diameter of 0.2 μm to yield a composition for formation of an upper antireflective film for Comparative Examples 1 to 2.

TABLE 1

| | Polymer | Refractive index (193 nm) | Developability | Pattern shape | Standing-wave effect |
|---|---|---|---|---|---|
| Example 1 | A-1 | 1.47 | good | good | good |
| Example 2 | A-2 | 1.44 | good | good | good |
| Example 3 | A-3 | 1.42 | good | good | good |
| Example 4 | A-4 | 1.46 | good | good | good |
| Example 5 | A-5 | 1.46 | good | good | good |
| Example 6 | A-6 | 1.43 | good | good | good |
| Example 7 | A-7 | 1.46 | good | good | good |
| Example 8 | A-8 | 1.45 | good | good | good |
| Comparative Example 1 | a-1 | 1.57 | good | good | insufficient |
| Comparative Example 2 | a-2 | 1.56 | good | good | insufficient |

[1-3] Measurement of Refractive Index

The refractive index (wavelength; 193 nm) of a film formed using the composition for formation of an upper antireflective film in Examples and Comparative Examples was measured according to the following method. The results are also shown in Table 1.

<Method for Measuring the Refractive Index>

The composition for formation of an upper antireflective film was coated onto a silicon wafer having a diameter of 8 inches by spin coating so as to set the film thickness of an antireflective film to be formed into the range from 26 to 33 nm. Thereafter, an ellipsometer "VUV-VASE" manufactured by J. A. Woolam Co., Inc. was used to measure the refractive index of the film.

[1-4] Evaluation of Performance

The composition for formation of an upper antireflective film in Examples and Comparative Examples was used to form a resist pattern and performances thereof as an antireflective film were evaluated. The evaluation results are also shown in Table 1.

(1) Formation of Resist Pattern

A chemically amplification type positive resist for an ArF excimer laser (trade name "ARX1682J" manufactured by JSR Corp.) was coated onto a silicon wafer having a diameter of 8 inches by spin coating and then the resultant was pre-baked on a hot plate heated to a temperature of 110° C. for 60 seconds to form a photoresist film having a thickness of 0.19 μm.

After that, the composition for formation of an upper antireflective film in Examples and Comparative Examples was coated onto the photoresist film by spin coating so as to set the film thickness of an antireflective film to be formed into the range from 26 to 33 nm. Subsequently, a scanner "NSRS306C" manufactured by Nikon Corp. was used at a wavelength of 193 nm to expose the film to light for a predetermined period. Immediately after the exposure, a post-exposure baking was conducted on a hot plate heated to a temperature of 115° C. for 60 seconds. Thereafter, an aqueous solution containing 2.38% by weight of tetramethylammonium hydroxide was used to develop at a temperature of 25° C. for 1 minute. And washing with water and drying were sequentially conducted to form a resist pattern.

(2) Evaluation of Upper Antireflective Film

<Developability>

A scanning electron microscope was used to examine the degree of a scum made of a residue from the upper antireflective film or the photoresist film, or the degree of an undeveloped portion in the film. A case where a scum or an undeveloped portion was not observed was judged as good developability.

<Pattern Shape>

A scanning electron microscope was used to observe a cross-sectional shape of a 160-nm 1L/1S pattern in the resists. Of cross-sectional shapes (a) to (f) illustrated in FIG. 1, a case of a shape (b), (c) or (d) was judged as good shape.

<Standing Wave Effect>

Photoresist films were formed on silicon wafers having a diameter of 8 inches, respectively, so as to give film thicknesses different, between the films, at intervals of 0.01 μm in the range from 0.18 to 0.24 μm, and then the upper antireflective films were formed in the same manner as the above-mentioned method. Subsequently, a reduction projection aligner was used to expose the wafers to light while the exposure dose was varied between the wafers. After that, post-exposure baking and development were conducted sequentially in the same manner as described above to form resist patterns.

Next, a scanning electron microscope was used to observe the wafer wherein the photoresist film thickness was 0.19 um to determine an exposure dose permitting a 160-nm 1L/1S pattern to be gained when a mask having a 160-nm 1L/1S pattern was used. Thereafter, the wafers having individual film thicknesses corresponding to the determined exposure dose were each observed to measure pattern dimensions obtained in the case of using a mask having a 160-nm 1L/1S pattern. The maximum value of the resultant pattern dimensions was represented by $E_{max}$ and the minimum value thereof was represented by $E_{min}$, and from the following formula, the S value (dimension fluctuation following a change in the film thickness) was calculated:

$$S=(E_{max}-E_{min})$$

The S value was used as an index for standing wave effect; in a case where the S value was smaller than 35, the case was judged as good standing wave effect.

[1-5] Effect of Examples

Clearly from the results in Table 1, it was verified that when the compositions for formation of an upper antireflective film in Examples 1 to 8, the standing wave effect could be sufficiently reduced.

2. Examples 9 to 17 and Comparative Examples 3 to 5

[2-1] Synthesis of Polymer (A)

Hereinafter, synthesis examples of polymers (A-9) to (A-11) will be described. Physical properties ("Mw" and "Copolymerization ratio") of the polymers in synthesis examples were measured in the same manner as those in the above-mentioned [1-1].

Synthesis Example 11

Into a separable flask equipped with a stirrer, a thermostat and a condenser was charged with 30 g of tetrahydrofuran (hereinafter, referred to as "THF"). The system was subjected to bubbling with a nitrogen gas for 15 minutes and 10.4809 g of 2-vinylnaphthalene, 9.5891 g of t-butyl α-trifluoromethyl acrylate and 1.8779 g of 2,2'-azobis(dimethyl 2-methylpropionate) were added. The internal temperature was raised to a temperature of 45° C. After one hour, the internal temperature was raised, so that the reactive components were caused to react with each other for 8 hours while the solution was refluxed at a temperature of about 70° C. The system was then cooled to a temperature of 25° C. Next, the resultant was vacuum-dried to remove the solvent, thereby yielding a copolymer.

This copolymer had an Mw of $3.5\times10^3$, and a copolymerization ratio (% by mole) of 2-vinylnaphthalene/α-trifluoromethyl acrylic acid was 50/50. This copolymer was taken as "polymer (A-9)".

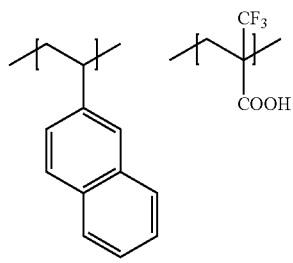

(A-9)

Synthesis Example 12

Into a separable flask equipped with a stirrer, a thermostat and a condenser was charged 30 g of methyl ethyl ketone. The system was subjected to bubbling with a nitrogen gas for 15 minutes and then 8.9840 g of 2-vinylnaphthalene, 8.1596 g of α-trifluoromethyl acrylic acid, 2.8600 g of maleic anhydride and 2.0122 g of 2,2'-azobis(dimethyl 2-methylpropionate) were added. The internal temperature was raised to a temperature of 45° C. After one hour, the internal temperature was raised, so that the reactive components were caused to react with each other at a temperature of 70° C. for 8 hours. The system was then cooled to a temperature of 25° C. Next, 3 g of a 1% aqueous solution of oxalic acid was added thereto in a slow dropwise manner. The internal temperature was then raised to a temperature of 70° C. to cause the reactive components to react with each other for 2 hours. Thereafter, the reaction solution was washed with 50 g of water 3 times, and then vacuum-dried to remove the solvent, thereby yielding a copolymer.

This copolymer had an Mw of $3.8 \times 10^3$, and a copolymerization ratio (% by mole) of 2-vinylnaphthalene/α-trifluoromethyl acrylic acid/maleic acid was 40/40/20. This copolymer was taken as "polymer (A-10)".

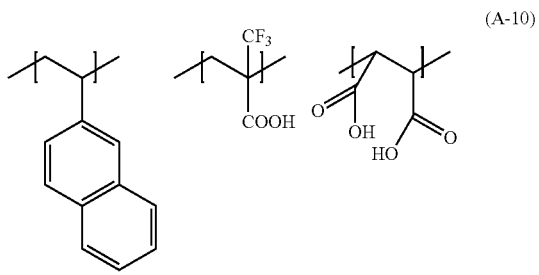
(A-10)

Synthesis Example 13

Into a separable flask equipped with a stirrer, a thermostat and a condenser was charged with 30 g of THF. The system was subjected to bubbling with a nitrogen gas for 15 minutes and 9.3063 g of 2-vinylnaphthalene, 9.3915 g of α-trifluoromethyl acrylic acid, 1.3000 g of 2-sulfoethyl methacrylate and 1.8528 g of 2,2'-azobis(dimethyl 2-methylpropionate) were added. The internal temperature was raised to a temperature of 45° C. After one hour, the internal temperature was raised, so that the reactive components were caused to react with each other for 8 hours while the solution was refluxed at a temperature of about 70° C. The system was then cooled to a temperature of 25° C. Next, the resultant was vacuum-dried to remove the solvent, thereby yielding a copolymer.

This copolymer had an Mw of $2.6 \times 10^3$, and a copolymerization ratio (% by mole) of 2-vinylnaphthalene/α-trifluoromethyl acrylic acid/2-sulfoethyl methacrylate was 45/50/5. This copolymer was taken as "polymer (A-11)".

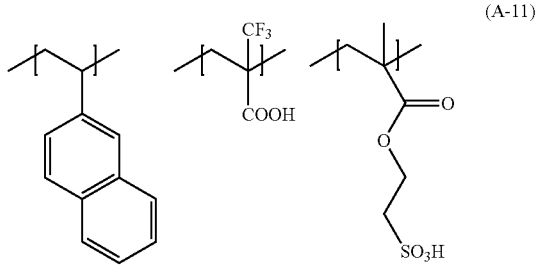
(A-11)

[2-2] Preparation of Composition for Formation of Upper Antireflective Film (II)

Examples 9 to 17

An acid generator (B) and a compound (C) that are shown in Table 2 were incorporated into 100 parts by weight of the polymer (A) shown in Table 2, and then 4-methyl-2-pentanol was added thereto so as to set the solid concentration therein to 1%. After that, the resultant was filtrated through a membrane filter having a pore diameter of 0.2 μm to yield a composition for formation of an upper antireflective film for Examples 9 to 17.

Comparative Examples 3 to 5

4-methyl-2pentanol was added to 100 parts by weight of the polymer shown in Table 2 to set the solid concentration to 1%, and then the resultant was filtrated through a membrane filter having a pore diameter of 0.2 μm to yield a composition for formation of an upper antireflective film for Comparative Examples 3 to 5.

TABLE 2

| | Polymer (A) (parts) | Acid generator (B) (parts) | Compound (C) (parts) | Refractive index (193 nm) |
|---|---|---|---|---|
| Example 9 | A-9 (100) | B-1 (3) | — | 1.39 |
| Example 10 | A-9 (100) | B-2 (3) | — | 1.39 |
| Example 11 | A-9 (100) | — | C-1 (3) | 1.39 |
| Example 12 | A-9 (100) | B-1 (3) | C-2 (0.3) | 1.39 |
| Example 13 | A-9 (100) | B-1 (3) | C-1 (3) | 1.39 |
| Example 14 | A-9 (100) | B-2 (3) | C-1 (3) | 1.39 |
| Example 15 | A-9 (100) | — | C-2 (0.3) | 1.39 |
| Example 16 | A-10 (100) | — | C-1 (3) | 1.45 |
| Example 17 | A-10 (100) | B-2 (3) | — | 1.45 |
| Comparative Example 3 | A-9 (100) | — | — | 1.39 |
| Comparative Example 4 | A-10 (100) | — | — | 1.45 |
| Comparative Example 5 | A-11 (100) | — | — | 1.42 |

Details of the components used for Examples and Comparative Examples in Table 2 are as follows:
<Acid Generator (B)>
(B-1): Triphenylsulfonium trifluoromethanesulfonate
(B-2): Triphenylsulfonium nonafluorobutanesulfonate
<Compound (C)>
(C-1): 5-sulfosalicylic acid
(C-2): Camphorsulfonic acid.
[2-3] Measurement of Refractive Index The refractive index (wavelength; 193 nm) of a film formed using the composition for formation of an upper antireflective film in Examples and Comparative Examples was measured in the same manner as in the above-mentioned [1-3]. The results are also shown in Table 2.

[2-4] Evaluation of Performance

The composition for formation of an upper antireflective film in Examples and Comparative Examples was used to form a resist pattern and performances thereof as an antireflective film were evaluated. The evaluation results are shown in Table 3.

(1) Formation of Resist Pattern

A resist pattern was formed in the same manner as in the above-mentioned [1-4].

(2) Evaluation of Upper Antireflective Film

In the same manner as in the above-mentioned [1-4], "developability", "pattern shape" and "standing wave effect" were evaluated. Furthermore, "blob defect" was also evaluated as follows.
<Blob Defect>

A chemically amplification type positive resist for an ArF excimer laser (trade name "ARX1682J" manufacture d by JSR Corp.) was coated onto a silicon wafer having a diameter of 8 inches by spin coating and then the resultant was pre-baked on a hot plate heated to a temperature of 110° C. for 60 seconds to form a photoresist film having a thickness of 0.19 μm.

After that, the composition for formation of an upper anti-reflective film was coated onto the photoresist film by spin coating so as to set the film thickness of an antireflective film to be formed into the range from 26 to 33 nm. Subsequently, a scanner "NSRS306C" manufactured by Nikon Corp. was used at a wavelength of 193 nm to expose the film to light for examining blob defects for a predetermined period. Immediately after the exposure, a post-exposure baking was conducted on a hot plate heated to a temperature of 115° C. for 60 seconds. Thereafter, an aqueous solution containing 2.38% by weight of tetramethylammonium hydroxide was used to develop at a temperature of 25° C. for 1 minute. And washing with water and drying were sequentially conducted to form a resist pattern.

Next, "KLA2351" manufactured by KLA-Tencor Corp. was used to detect defects. A case where the number of detected defects based on development-exfoliation was 500 or less was judged to be good, and a case where the number was more than 500 was judged to be insufficient.

TABLE 3

| | Develop-ability | Pattern shape | Standing-wave effect | Blob defect |
|---|---|---|---|---|
| Example 9 | good | good | good | good |
| Example 10 | good | good | good | good |
| Example 11 | good | good | good | good |
| Example 12 | good | good | good | good |
| Example 13 | good | good | good | good |
| Example 14 | good | good | good | good |
| Example 15 | good | good | good | good |
| Example 16 | good | good | good | good |
| Example 17 | good | good | good | good |
| Comparative Example 3 | good | good | good | insufficient |
| Comparative Example 4 | good | insufficient | good | insufficient |
| Comparative Example 5 | good | insufficient | good | good |

[2-5] Effect of Examples

Clearly from the results in Table 3, the compositions for formation of an upper antireflective film in Examples 9 to 17 made it possible to reduce standing wave effect and blob defects sufficiently.

The invention claimed is:

1. A composition for forming an upper antireflective film characterized by comprising a polymer (A) which is soluble in an alkaline developer and has an aromatic group, and at least one component selected from the group consisting of a photosensitive acid generator (B) and a compound (C) having a sulfonic acid residue and being different from the polymer (A),
wherein said polymer (A) comprises a repeating unit represented by the following formula (VIII) and a repeating unit represented by the following formula (IX),

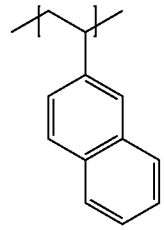

(VIII)

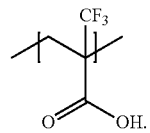

(IX)

2. A method for forming a resist pattern characterized by comprising:
forming a photoresist film on a substrate;
forming an upper antireflective film on said photoresist film, using the composition for forming an upper antireflective film as recited in claim 1;
irradiating a predetermined region of said photoresist film on which said upper antireflective film is formed with a radiation, thereby performing exposure; and
developing the resultant to remove said upper antireflective film.

3. The composition for forming an upper antireflective film according to claim 1,
wherein said polymer (A) further comprises at least one unit selected from the group consisting of repeating units represented by the following formulae (IV), (VI) and (VII),

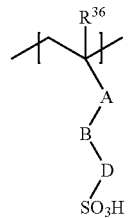

(IV)

wherein in the formula (IV), $R^{36}$ represents a hydrogen atom, a methyl group, a hydroxymethyl group or a trifluoromethyl group, A represents a single bond, a carbonyl group or a carbonyloxy group, B represents a single bond or an imino group, and D represents a single bond, a linear, branched or alicyclic hydrocarbon group having carbon atoms of 1 to 20, or an aromatic hydrocarbon group which may have a substituent,

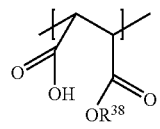

(VI)

wherein in the formula (VI), $R^{38}$ represents a hydrogen atom, an alkyl group having carbon atoms of 1 to 12, or a fluorinated alkyl group having carbon atoms of 1 to 12,

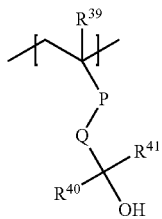
(VII)

wherein in the formula (VII), $R^{39}$ represents a hydrogen atom, a methyl group, a hydroxymethyl group or a trifluoromethyl group, P represents a single bond, a carbonyl group or a carbonyloxy group, Q represents a single bond, a linear, branched or alicyclic hydrocarbon group having carbon atoms of 1 to 20, or an aromatic hydrocarbon group which may have a substituent, and $R^{40}$ and $R^{41}$ each independently represent a hydrogen atom, an alkyl group having carbon atoms of 1 to 4 or a fluorinated alkyl group having carbon atoms of 1 to 4.

4. The composition for forming an upper antireflective film according to claim 1, wherein said compound (C) is a compound represented by the following (I),

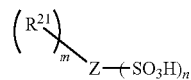
(I)

wherein in the formula (I), $R^{21}$ represents a linear or branched alkyl group having carbon atoms of 1 to 10, an alicyclic alkyl group having carbon atoms of 3 to 20 or a derivative thereof, a hydroxyl group, a carboxyl group, an alkylether group, an alkyloxycarbonyl group or an alkylcarbonyloxy group, Z represents a linear, branched or alicyclic hydrocarbon group, having carbon atoms of 4 to 12, or an aromatic hydrocarbon group which may have a substituent, m is an integer of 0 to 4, and n is an integer of 1 to 4, when plural $R^{21}$s are present, $R^{21}$s may be the same or different from each other.

* * * * *